US012628614B2

(12) United States Patent (10) Patent No.: US 12,628,614 B2
Yamasaki et al. (45) Date of Patent: May 12, 2026

(54) BONDING APPARATUS, BONDING SYSTEM, AND BONDING METHOD

(71) Applicant: Tokyo Electron Limited, Tokyo (JP)

(72) Inventors: Yutaka Yamasaki, Koshi (JP); Takashi Terada, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 1202 days.

(21) Appl. No.: 17/594,975

(22) PCT Filed: Apr. 27, 2020

(86) PCT No.: PCT/JP2020/018011
§ 371 (c)(1),
(2) Date: Nov. 4, 2021

(87) PCT Pub. No.: WO2020/226095
PCT Pub. Date: Nov. 12, 2020

(65) Prior Publication Data
US 2022/0285196 A1 Sep. 8, 2022

(30) Foreign Application Priority Data
May 8, 2019 (JP) ................................. 2019-088100

(51) Int. Cl.
*H01L 21/68* (2006.01)
*H01L 21/18* (2006.01)
(Continued)

(52) U.S. Cl.
CPC ............ *H10P 72/53* (2026.01); *H10P 10/128* (2026.01); *H10P 72/72* (2026.01); *H10P 72/7612* (2026.01); *H10P 72/7618* (2026.01)

(58) Field of Classification Search
CPC . H01L 21/681; H01L 21/187; H01L 21/6831; H01L 21/68742; H01L 21/68764;
(Continued)

(56) References Cited

U.S. PATENT DOCUMENTS 9,469,093 B2 10/2016 Wada et al.
10,553,565 B2 * 2/2020 Guo .................. H01L 21/67288
(Continued)

FOREIGN PATENT DOCUMENTS

JP 2004-146528 A 5/2004
JP 2005-294800 A 10/2005
(Continued)

OTHER PUBLICATIONS

International Search Report for PCT/JP2020/018011 dated Jul. 14, 2020.

*Primary Examiner* — Alex B Efta
*Assistant Examiner* — Alexander S Wright
(74) *Attorney, Agent, or Firm* — Chrisman Gallo Tochtrop LLC

(57) ABSTRACT

A bonding apparatus configured to bond a first substrate and a second substrate includes a first holder configured to hold the first substrate; a second holder disposed to face the first holder, and configured to hold the second substrate; two imaging units each including a first imaging device configured to image a first alignment mark formed on a bonding surface of the first substrate and a second imaging device configured to image a second alignment mark formed on a bonding surface of the second substrate; a first moving mechanism configured to move the two imaging units along a first direction in a planar region between the first holder and the second holder; a second moving mechanism configured to move the first imaging unit along a second direction orthogonal to the first direction; and a third moving
(Continued)

mechanism configured to move the second imaging unit along the second direction.

11 Claims, 25 Drawing Sheets

(51) Int. Cl.

| | | |
|---|---|---|
| *H01L 21/683* | (2006.01) | |
| *H01L 21/687* | (2006.01) | |
| *H10P 10/00* | (2026.01) | |
| *H10P 72/50* | (2026.01) | |
| *H10P 72/72* | (2026.01) | |
| *H10P 72/76* | (2026.01) | |

(58) Field of Classification Search

CPC ......... H01L 21/67092; H01L 21/67748; H01L 21/68707; H01L 2223/5442; H01L 2223/54426; H01L 2223/54453; H01L 23/544

See application file for complete search history.

(56) References Cited

U.S. PATENT DOCUMENTS

| | | | |
|---|---|---|---|
| 2007/0252994 A1 | 11/2007 | Bijnen et al. | |
| 2009/0251699 A1* | 10/2009 | George | H01L 23/544 |
| | | | 356/399 |
| 2014/0158280 A1* | 6/2014 | Kurimura | C08F 222/102 |
| | | | 156/247 |
| 2019/0043745 A1* | 2/2019 | Zhang | H01L 21/681 |
| 2019/0148184 A1* | 5/2019 | Sugaya | H01L 21/68714 |
| | | | 438/455 |
| 2019/0198371 A1 | 6/2019 | Wagenleitner et al. | |

FOREIGN PATENT DOCUMENTS

| | | |
|---|---|---|
| JP | 2007-095738 A | 4/2007 |
| JP | 2011-071225 A | 4/2011 |
| JP | 2012-049266 A | 3/2012 |
| JP | 2012-089696 A | 5/2012 |
| JP | 2016-134446 A | 7/2016 |
| JP | 2018-056507 A | 4/2018 |
| KR | 10-2013-0058596 A | 6/2013 |
| KR | 10-2014-0037756 A | 3/2014 |
| WO | 2018/041326 A1 | 3/2018 |

* cited by examiner

1

BONDING APPARATUS, BONDING SYSTEM, AND BONDING METHOD

CROSS-REFERENCE TO RELATED APPLICATIONS

This Application is a U.S. national phase application under 35 U.S.C. § 371 of PCT Application No. PCT/JP2020/018011 filed on Apr. 27, 2020, which claims the benefit of Japanese Patent Application No. 2019-088100 filed on May 8, 2019, the entire disclosures of which are incorporated herein by reference.

TECHNICAL FIELD

The various aspects and embodiments described herein pertain generally to a bonding apparatus, a bonding system, and a bonding method.

BACKGROUND

Patent Document 1 discloses a bonding apparatus for bonding substrates. The bonding apparatus is equipped with a first holder configured to hold a first substrate, a second holder configured to hold a second substrate, a chamber accommodating the first holder and the second holder, and an imaging device provided outside the chamber. The imaging device images alignment marks formed on the first substrate and the second substrate via through holes respectively formed through the chamber, the first holder and the second holder.

Patent Document 1: Japanese Patent Laid-open Publication No. 2016-134446

SUMMARY

In an exemplary embodiment, a bonding apparatus configured to bond a first substrate and a second substrate includes a first holder configured to hold the first substrate; a second holder disposed to face the first holder, and configured to hold the second substrate; two imaging units each including a first imaging device configured to image a first alignment mark formed on a bonding surface of the first substrate and a second imaging device configured to image a second alignment mark formed on a bonding surface of the second substrate; a first moving mechanism configured to move the two imaging units along a first direction in a planar region between the first holder and the second holder; a second moving mechanism configured to move the first imaging unit of the two imaging units along a second direction orthogonal to the first direction; and a third moving mechanism configured to move the second imaging unit of the two imaging units along the second direction.

2

Figure 5:
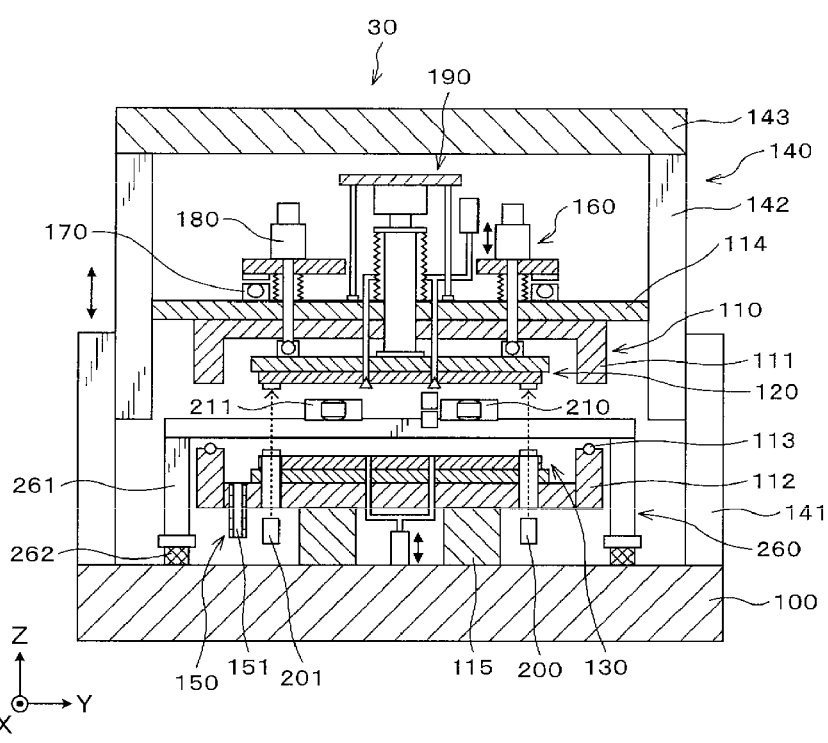

FIG. 5 is a side view illustrating a schematic configuration of a bonding apparatus.

Figure 6:
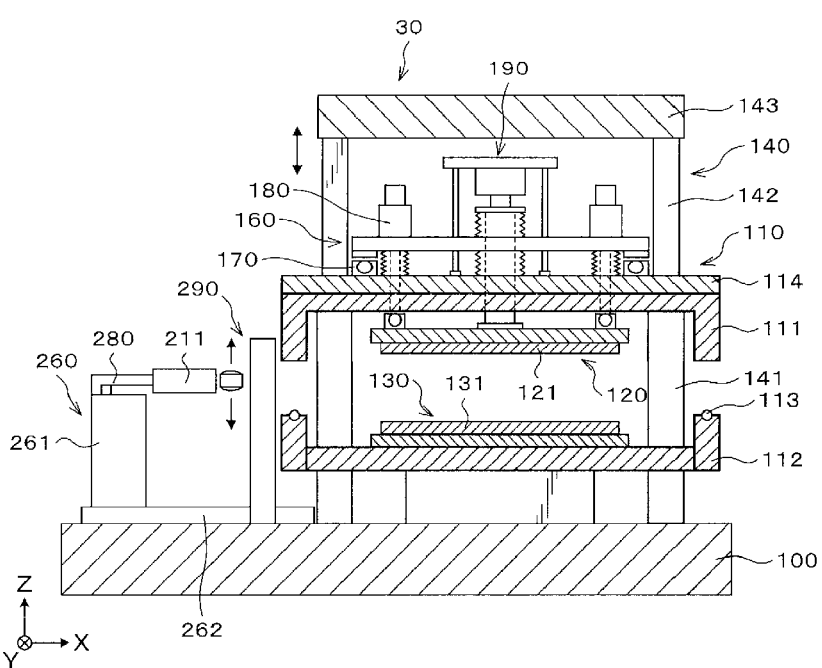

FIG. 6 is a side view illustrating the schematic configuration of the bonding apparatus.

Figure 7:
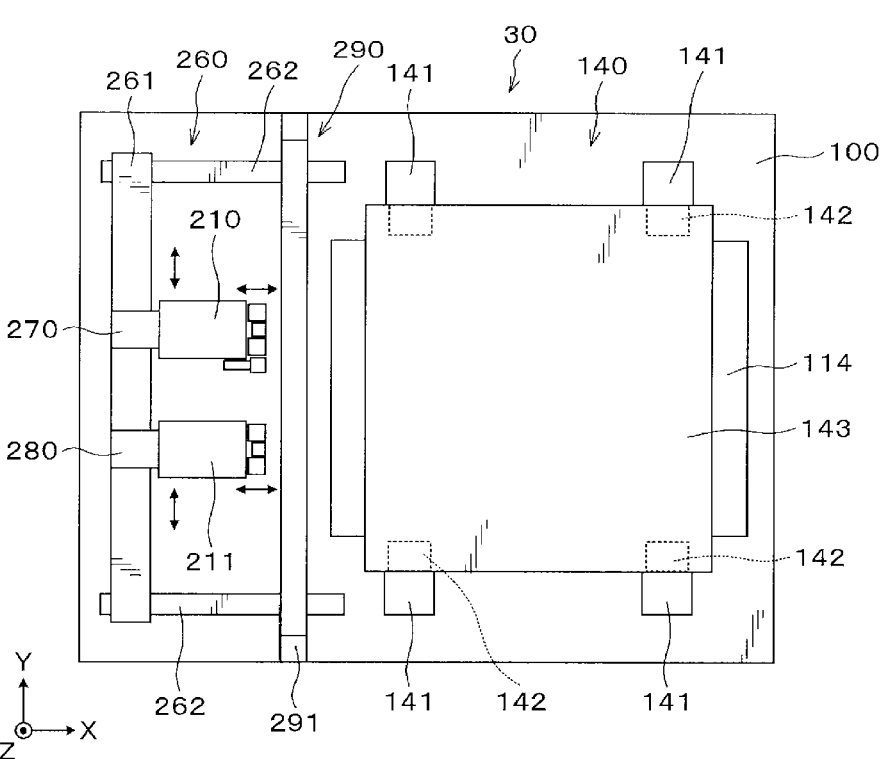

FIG. 7 is a plan view illustrating the schematic configuration of the bonding apparatus.

Figure 8:
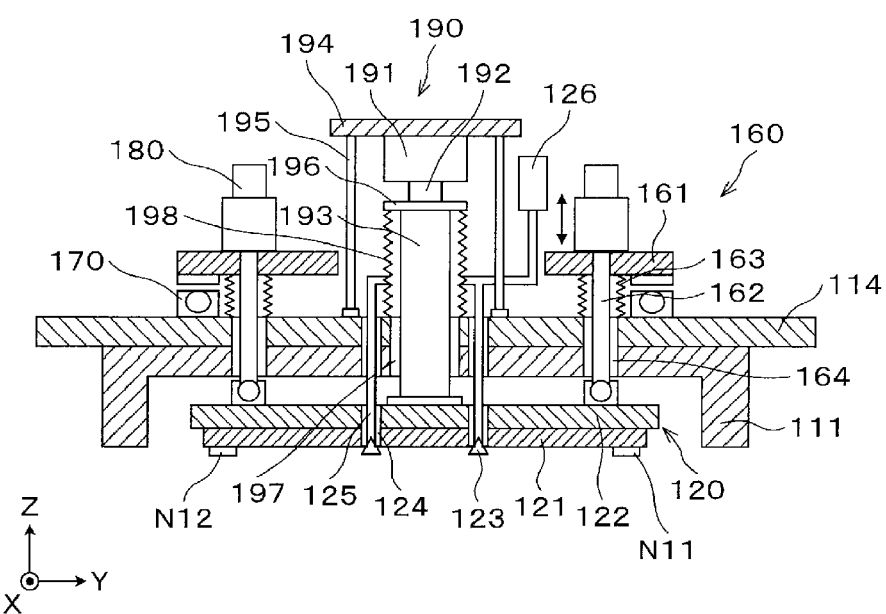

FIG. 8 is a cross sectional view illustrating a configuration of a first holder and the vicinity thereof.

Figure 9:
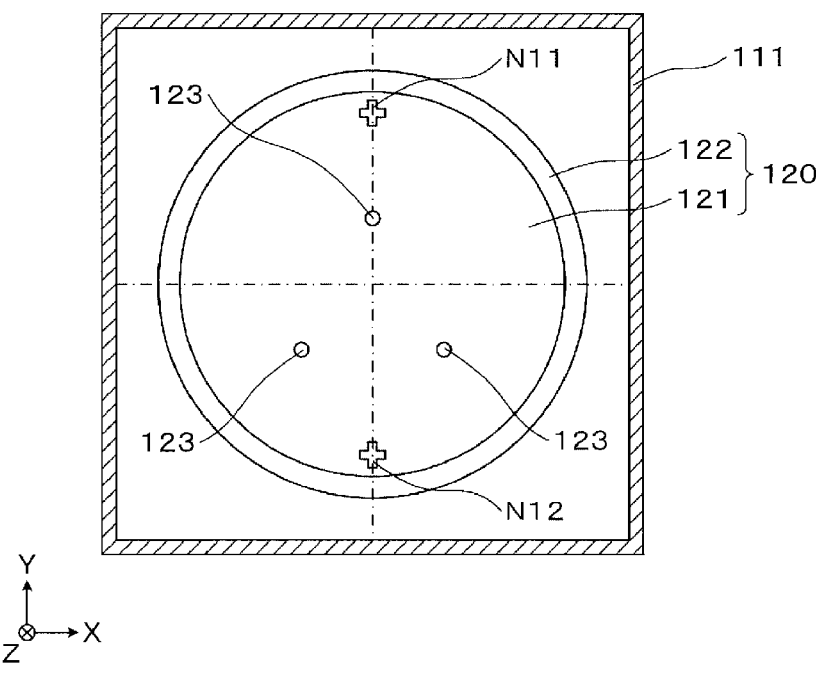

FIG. 9 is a plan view illustrating the first holder and the vicinity thereof seen from below.

Figure 10:
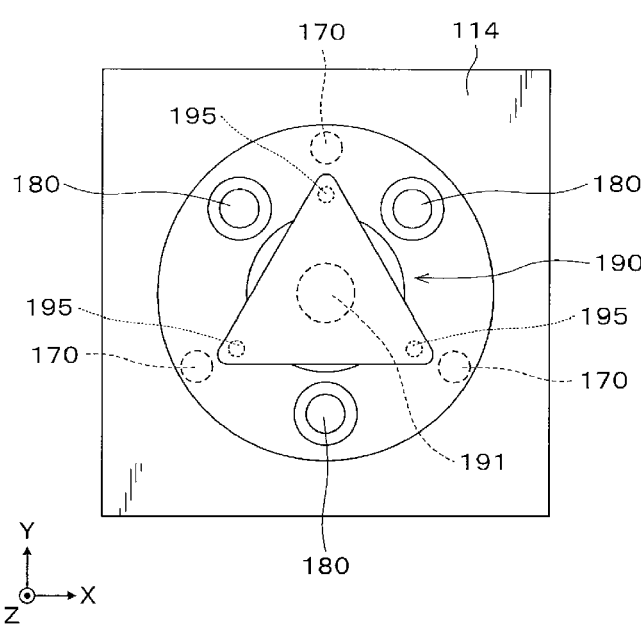

FIG. 10 is a plan view illustrating the first holder and the vicinity thereof seen from above.

Figure 11:
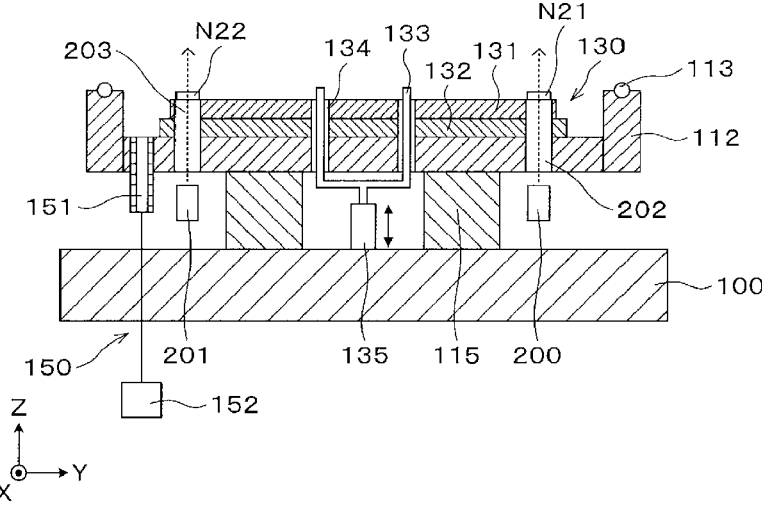

FIG. 11 is a cross sectional view illustrating a configuration of a second holder and the vicinity thereof.

Figure 12:
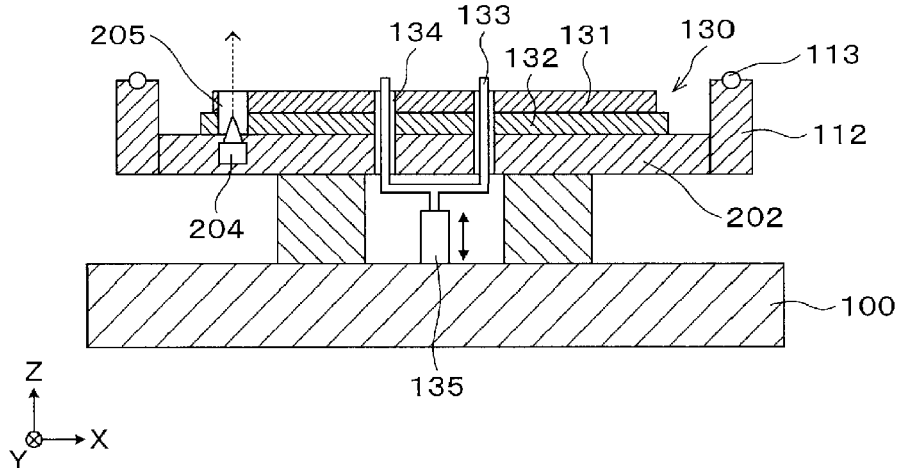

FIG. 12 is a cross sectional view illustrating the configuration of the second holder and the vicinity thereof.

Figure 13:
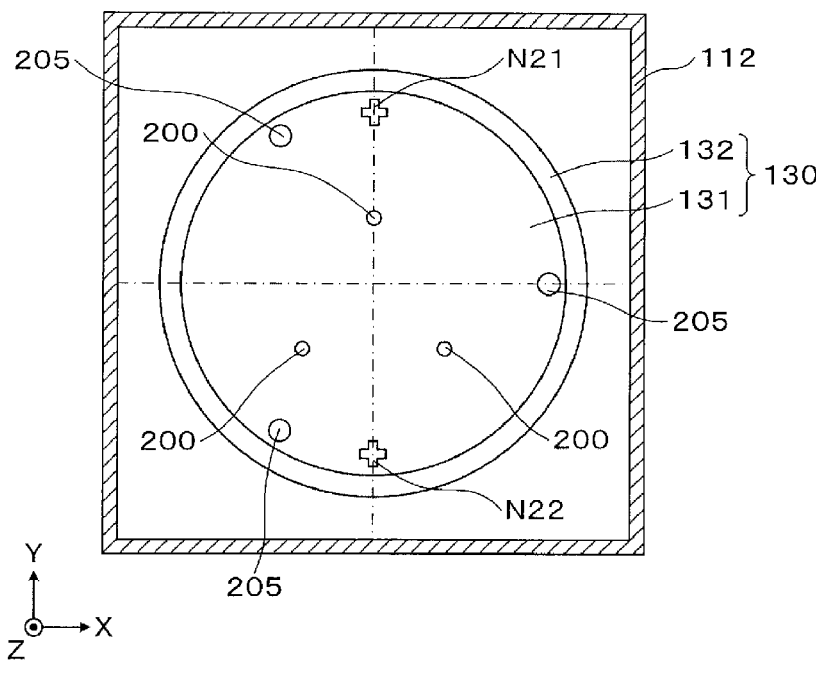

FIG. 13 is a plan view illustrating the second holder and the vicinity thereof seen from above.

Figure 14:
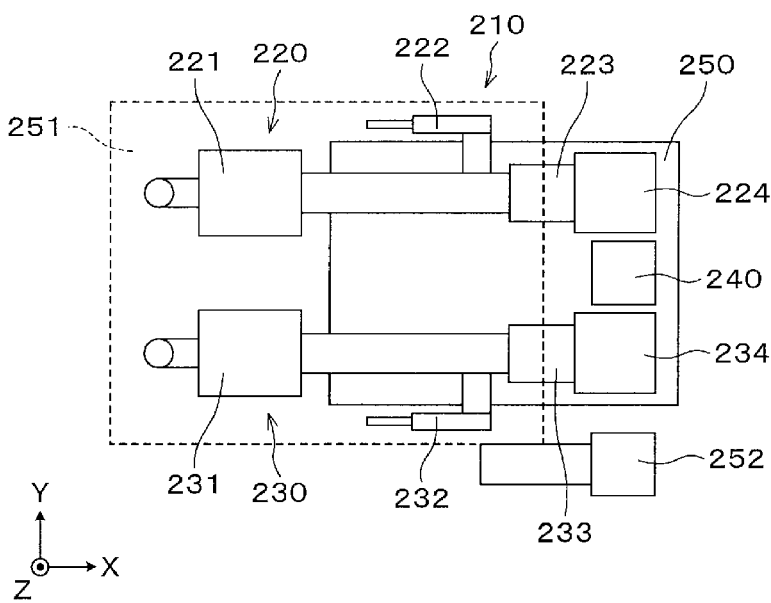

FIG. 14 is a plan view illustrating a schematic configuration of a first imaging unit.

Figure 15:
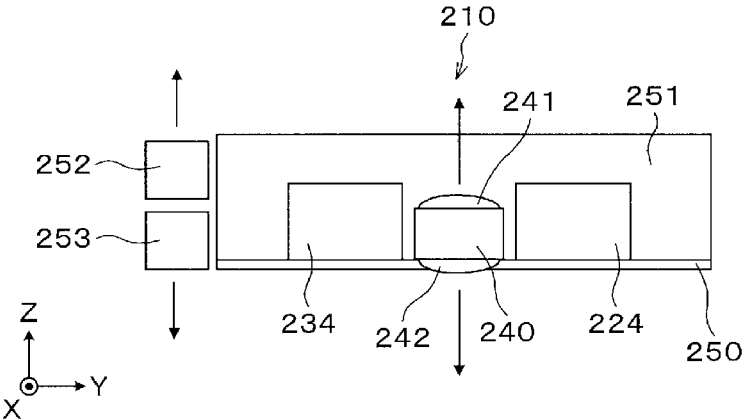

FIG. 15 is a side view illustrating the schematic configuration of the first imaging unit.

Figures 16A, 16B, 16C:
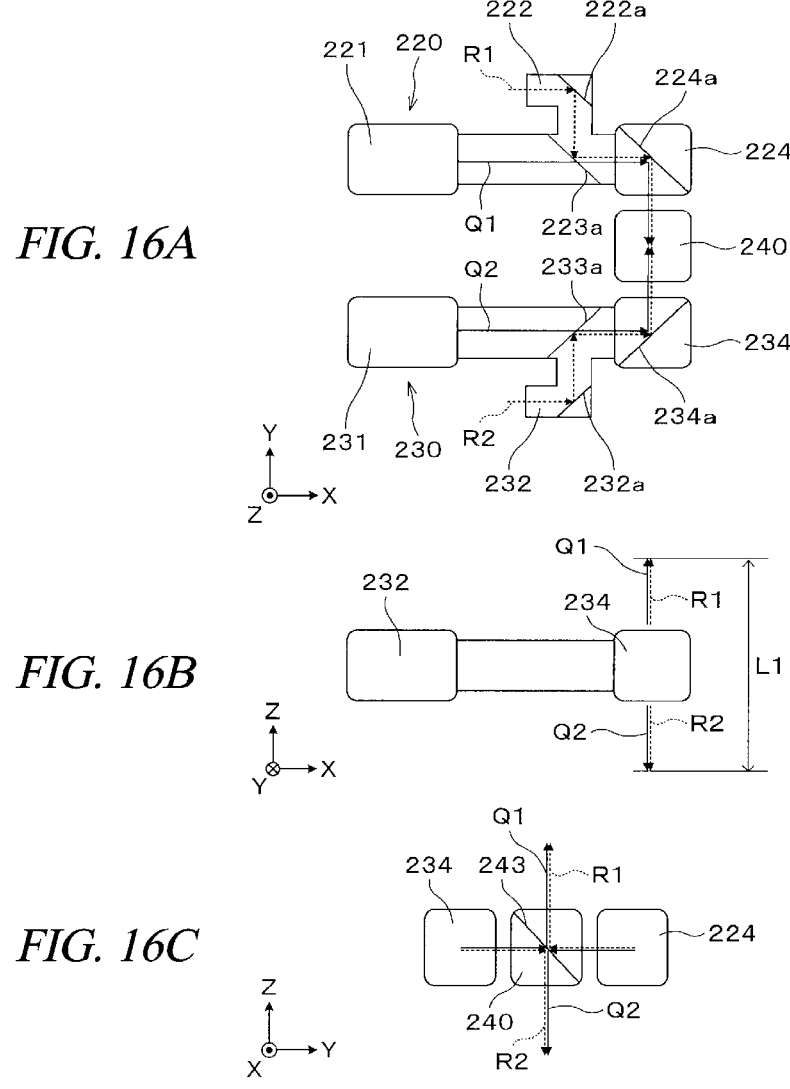

FIG. 16A to FIG. 16C are explanatory diagrams schematically illustrating an internal configuration of the first imaging unit.

Figure 17:
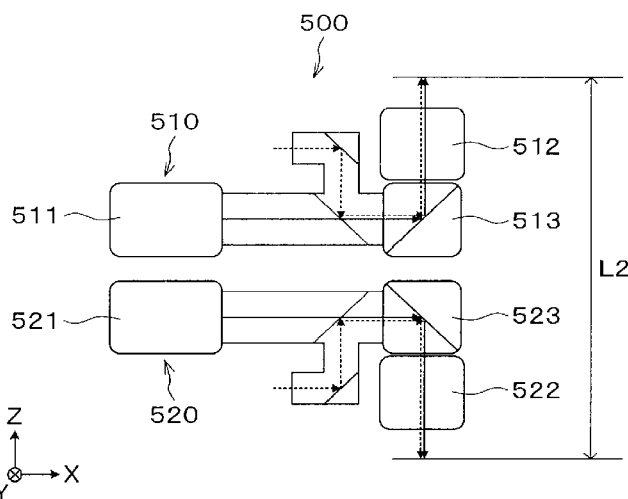

FIG. 17 is an explanatory diagram schematically illustrating an internal configuration of a conventional imaging unit.

Figure 18:
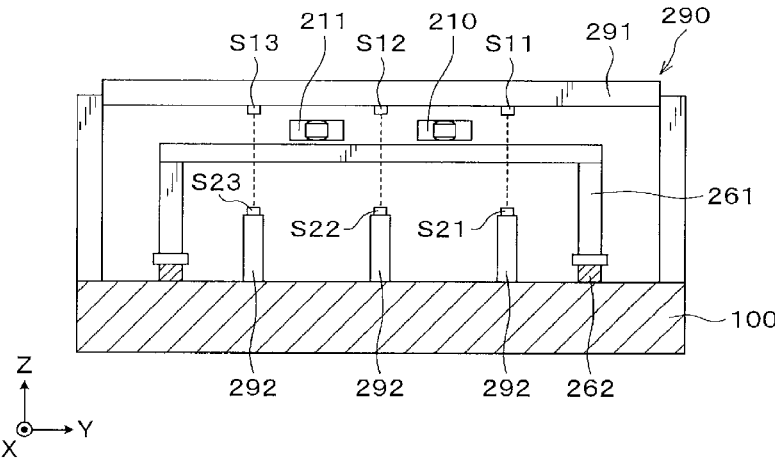

FIG. 18 is a side view illustrating a schematic configuration of a reference mark unit.

Figure 19:
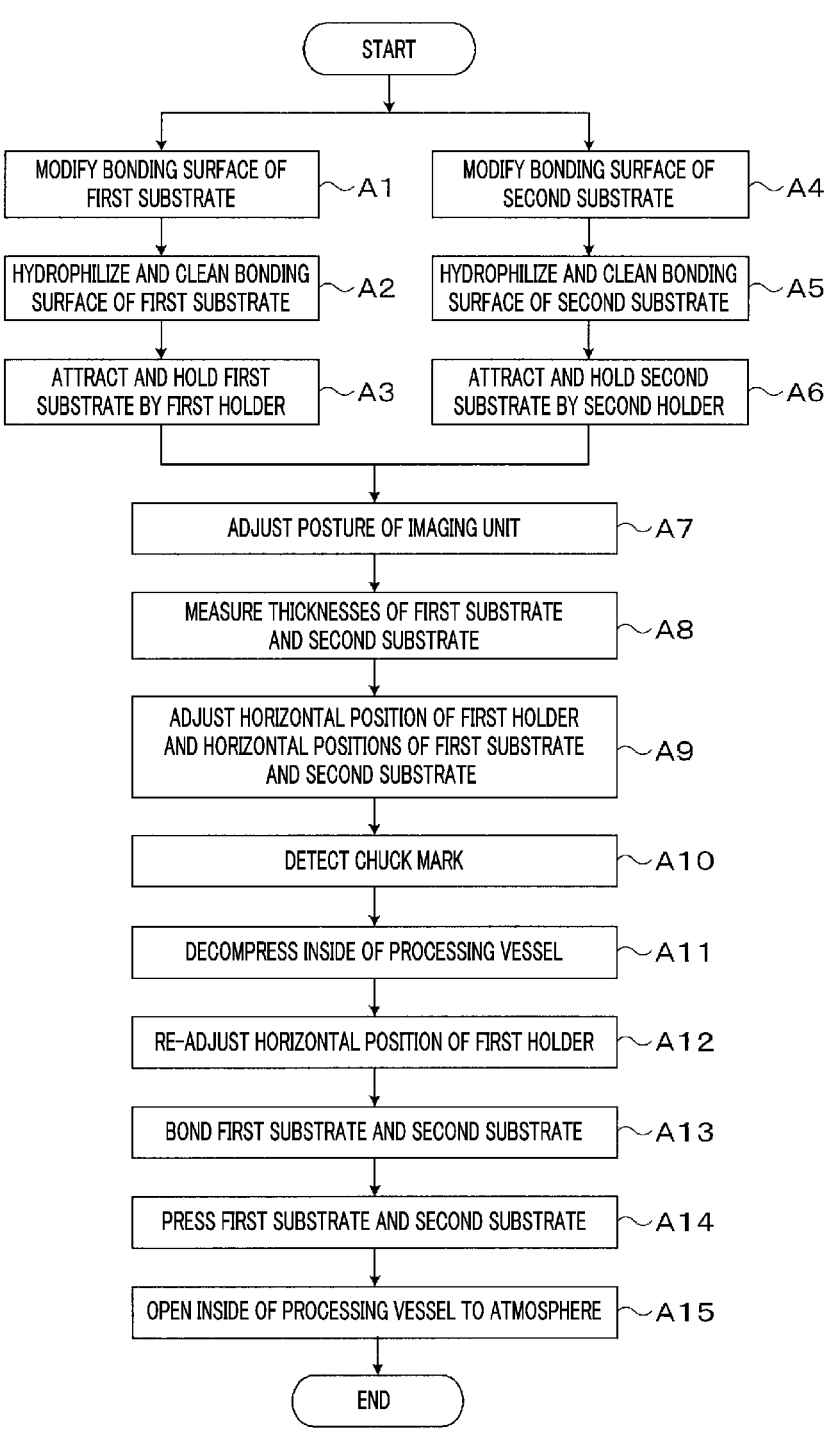

FIG. 19 is a flowchart illustrating main processes of a bonding processing.

Figure 20A:
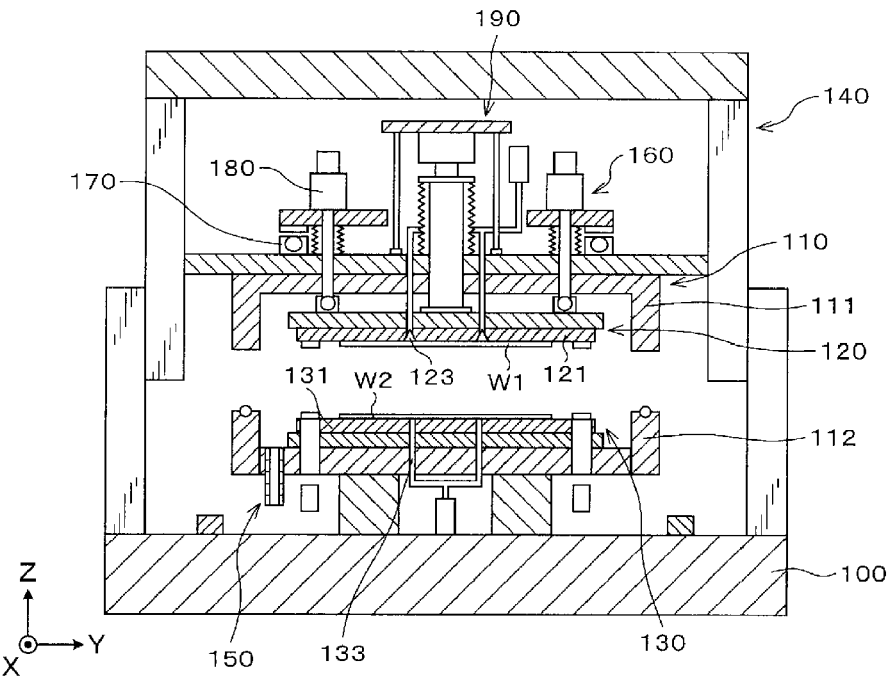
Figure 20B:
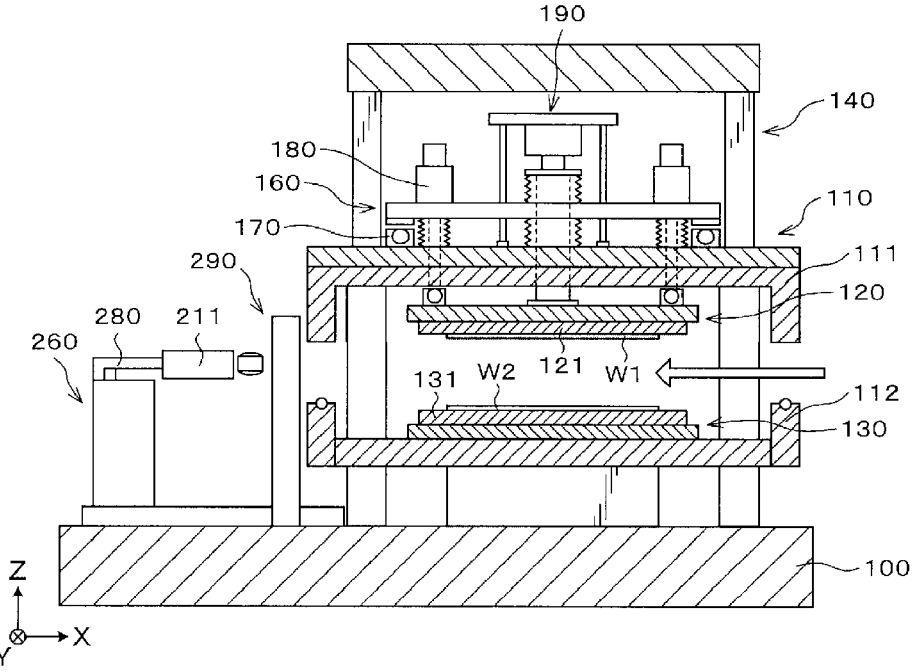

FIG. 20A and FIG. 20B are explanatory diagrams illustrating processes A3 and A6 of the bonding processing.

Figure 21A:
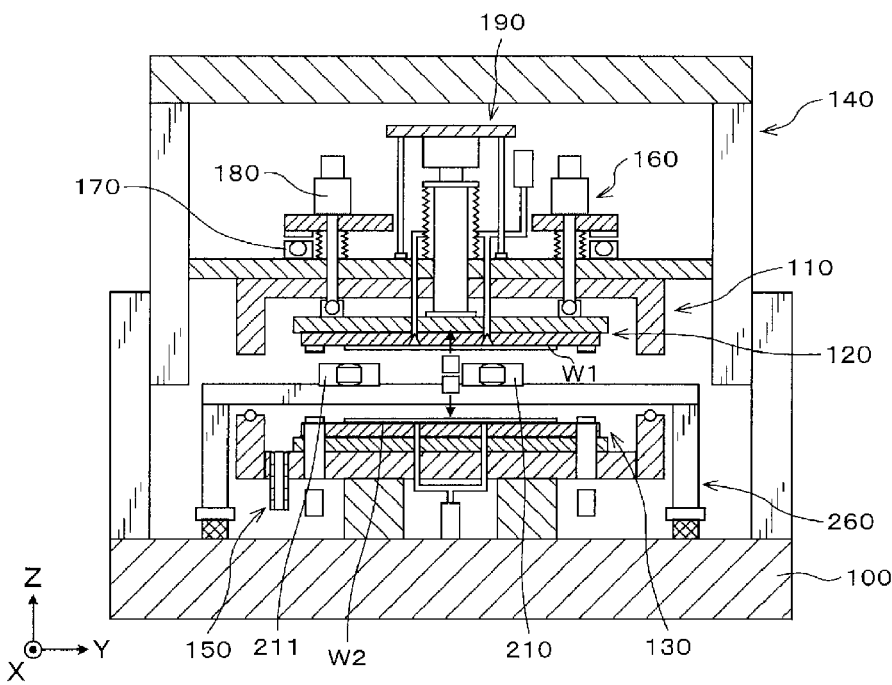
Figure 21B:
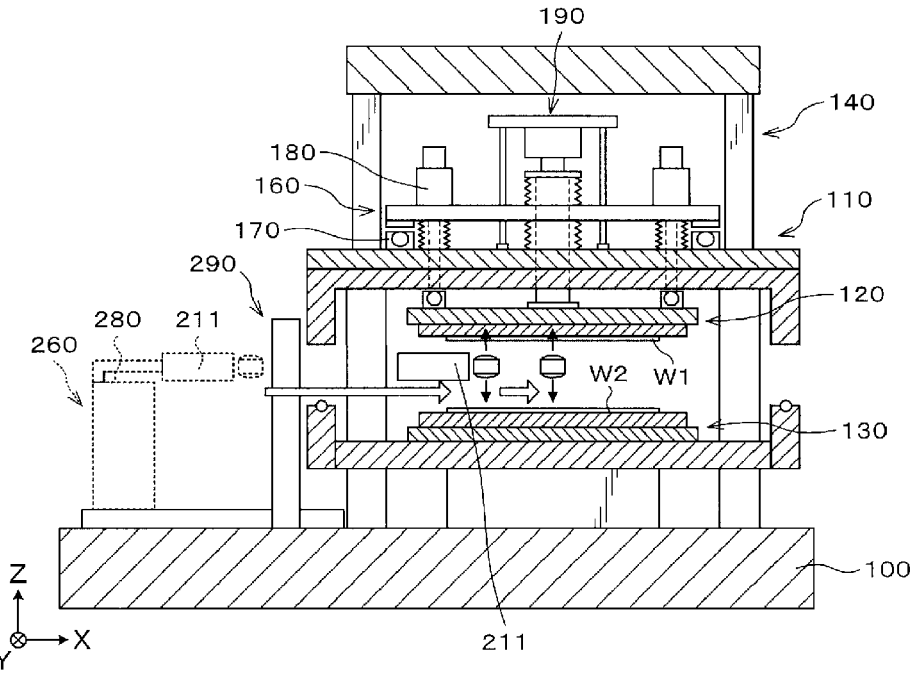

FIG. 21A and FIG. 21B are explanatory diagrams illustrating processes A7 and A8 of the bonding processing.

Figure 22A:
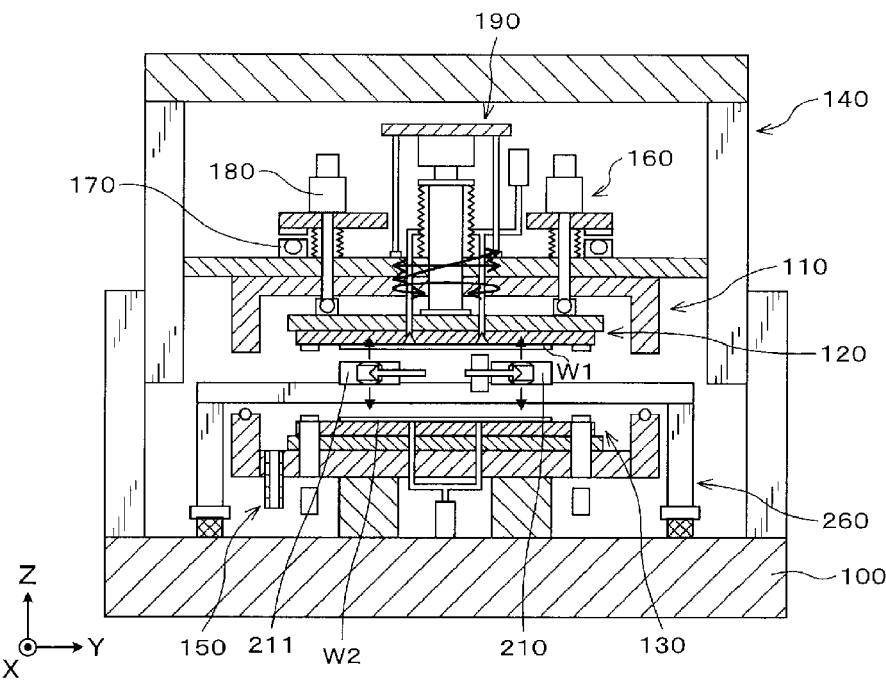
Figure 22B:
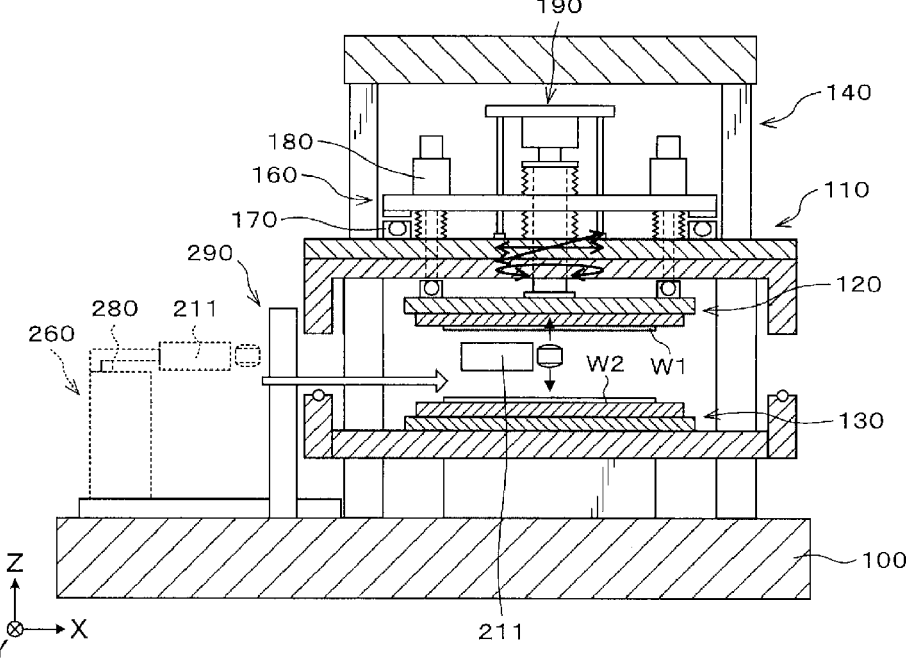

FIG. 22A and FIG. 22B are explanatory diagrams illustrating a process A9 of the bonding processing.

Figure 23A:
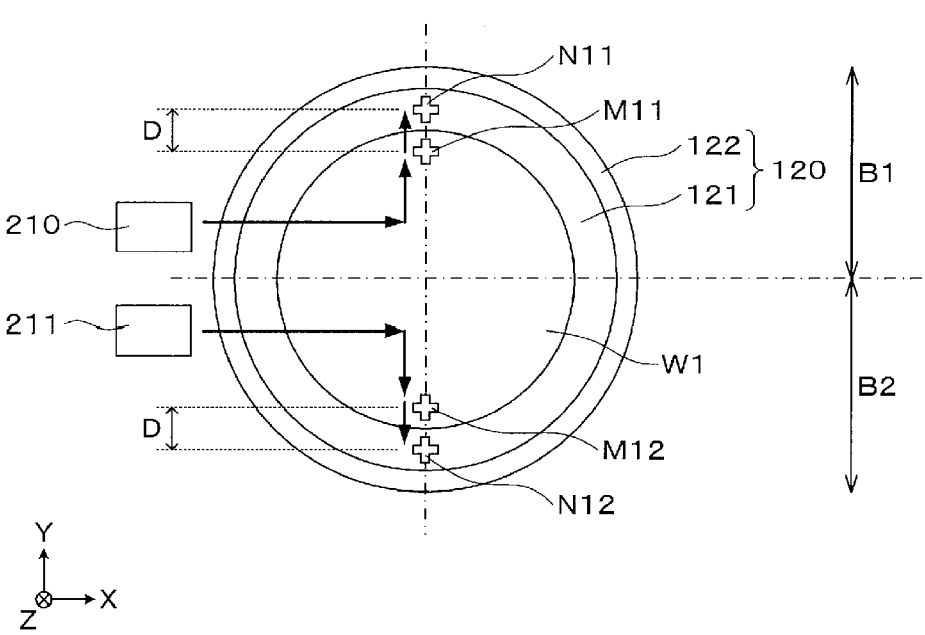
Figure 23B:
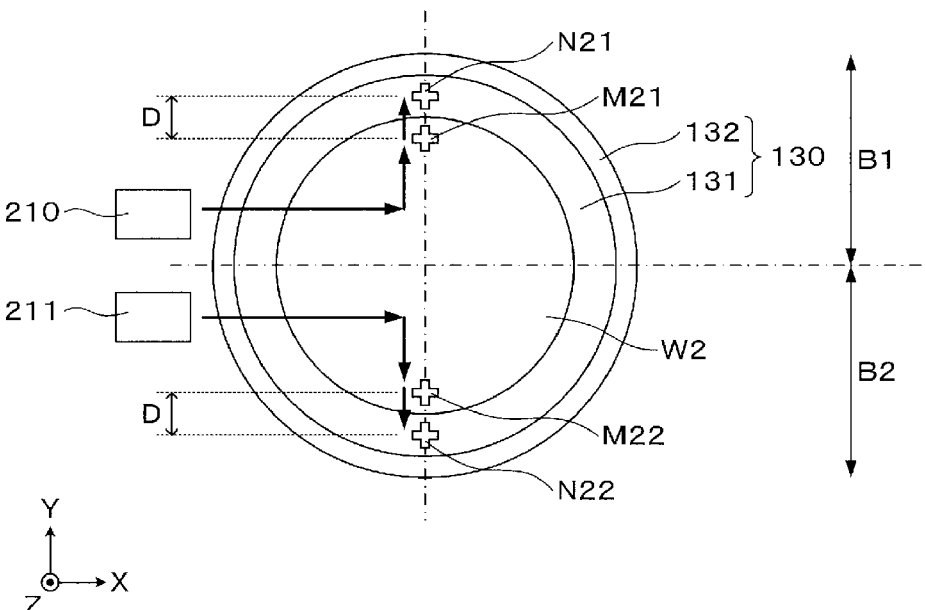

FIG. 23A and FIG. 23B are explanatory diagrams illustrating the process A9 and a process A10 of the bonding processing.

Figure 24A:
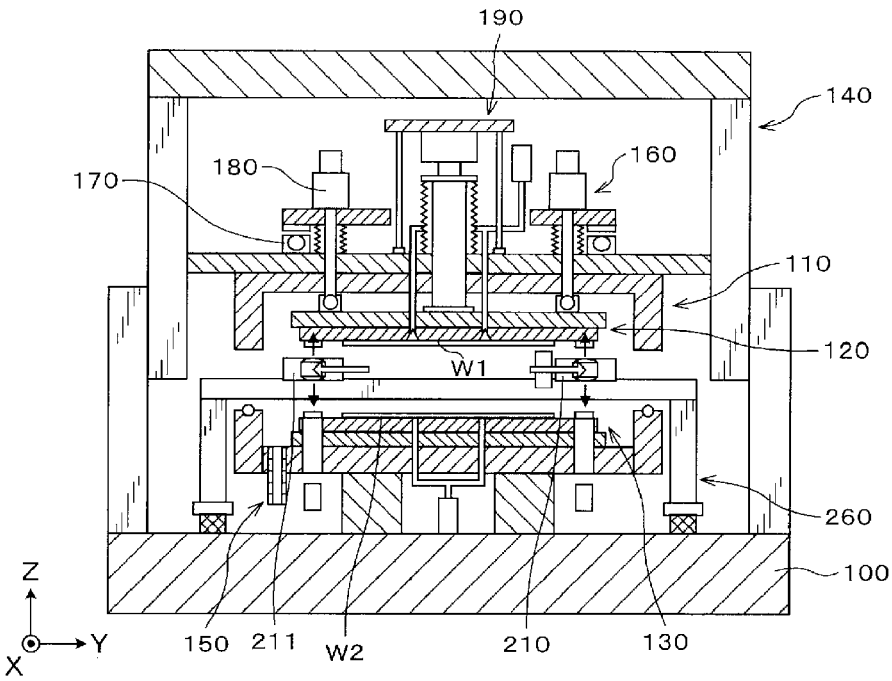
Figure 24B:
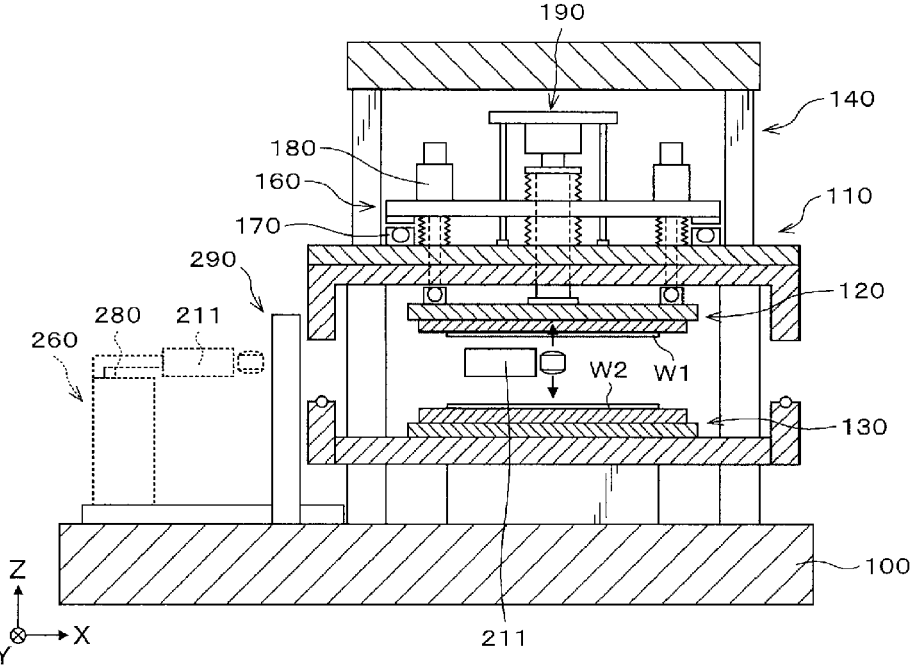

FIG. 24A and FIG. 24B are explanatory diagrams illustrating the process A10 of the bonding processing.

Figure 25A:
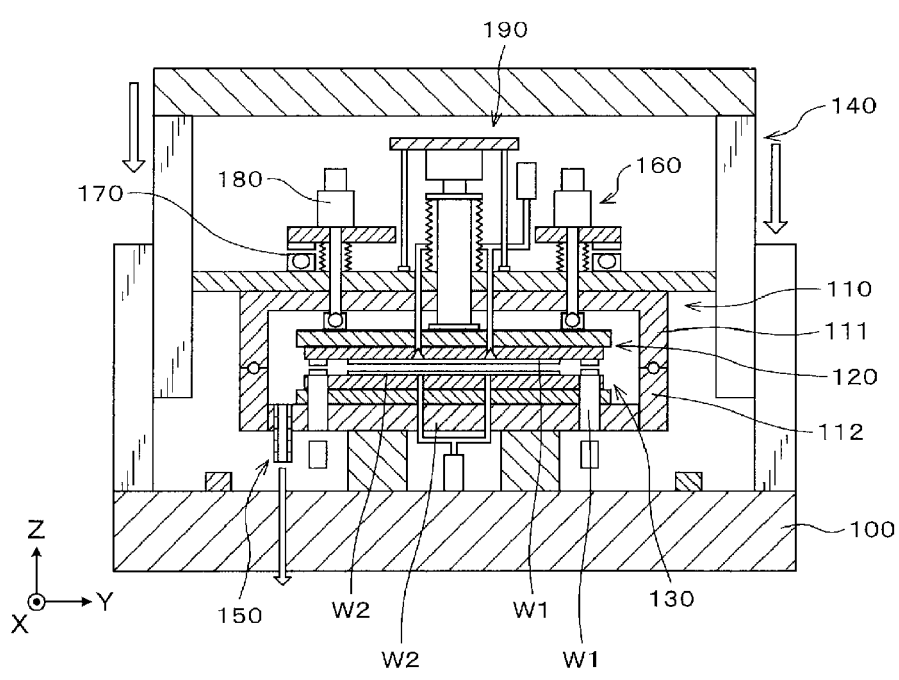
Figure 25B:
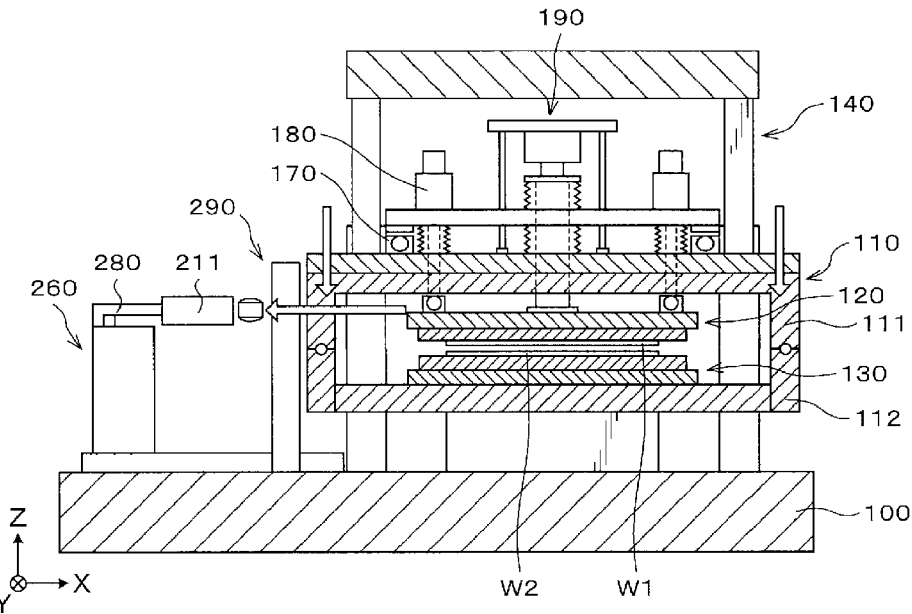

FIG. 25A and FIG. 25B are explanatory diagrams illustrating a process A11 of the bonding processing.

Figure 26A:
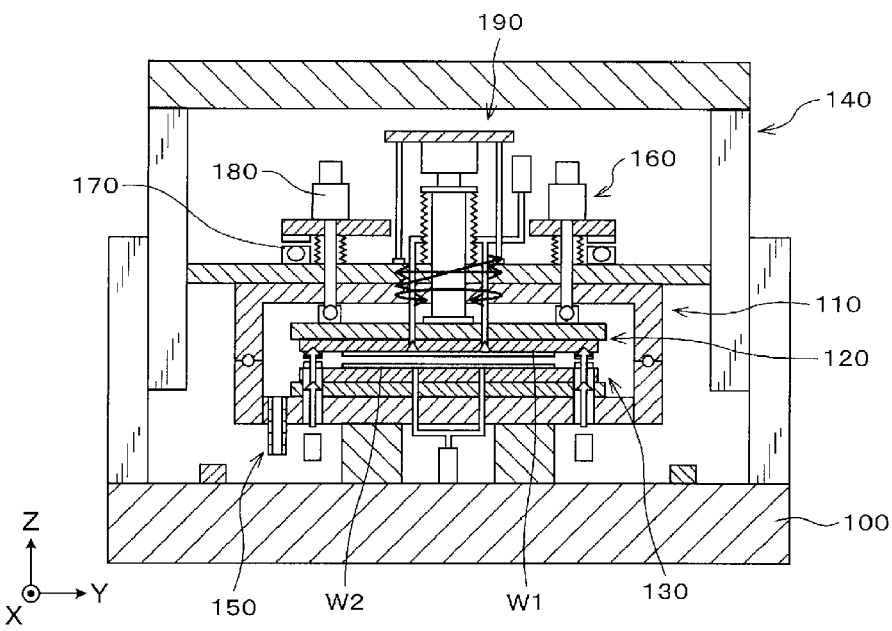
Figure 26B:
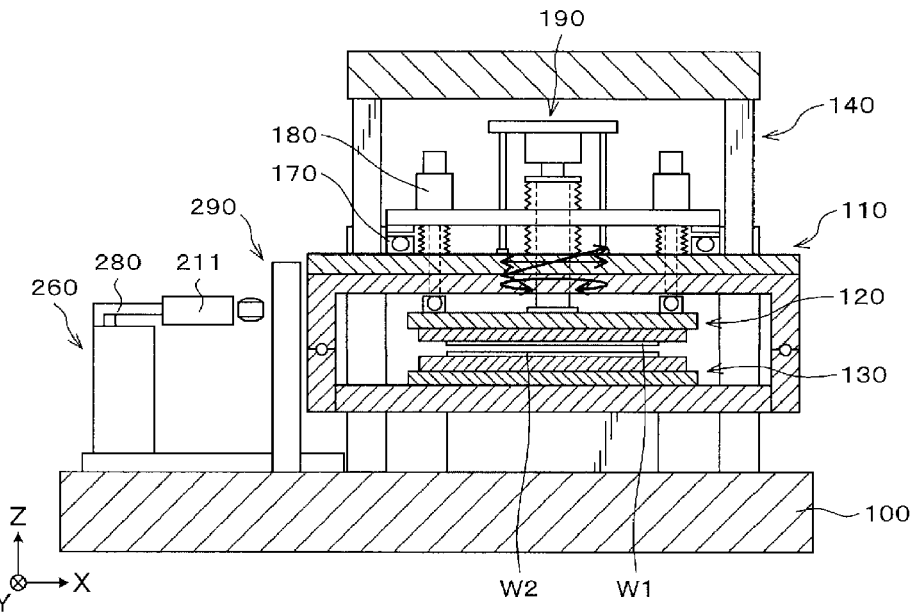

FIG. 26A and FIG. 26B are explanatory diagrams illustrating a process A12 of the bonding processing.

Figure 27A:
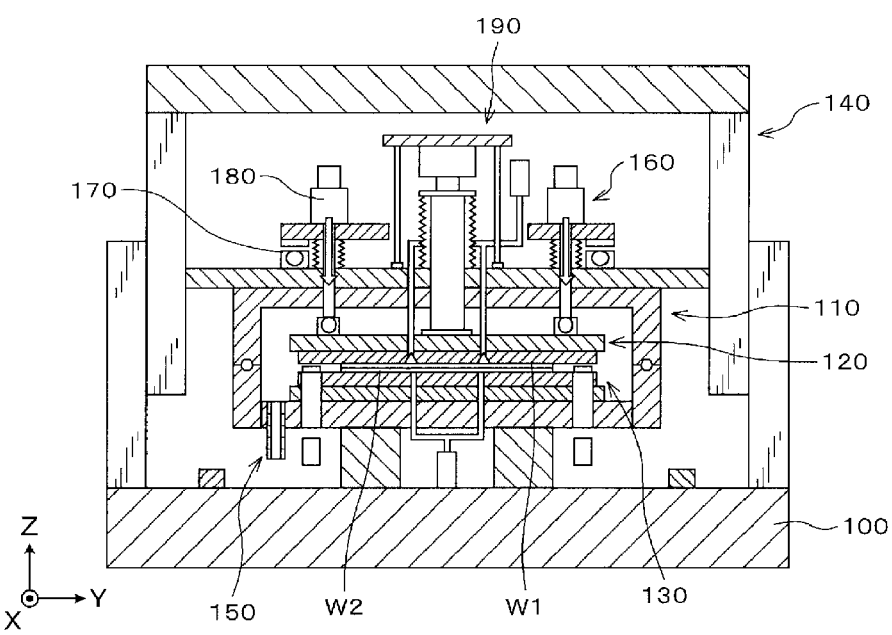
Figure 27B:
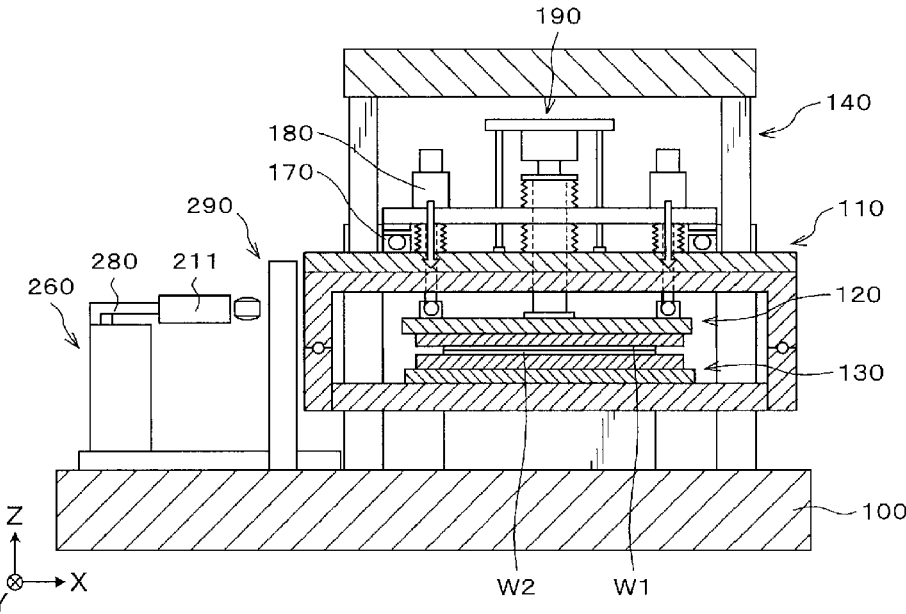

FIG. 27A and FIG. 27B are explanatory diagrams illustrating a process A13 of the bonding processing.

Figure 28A:
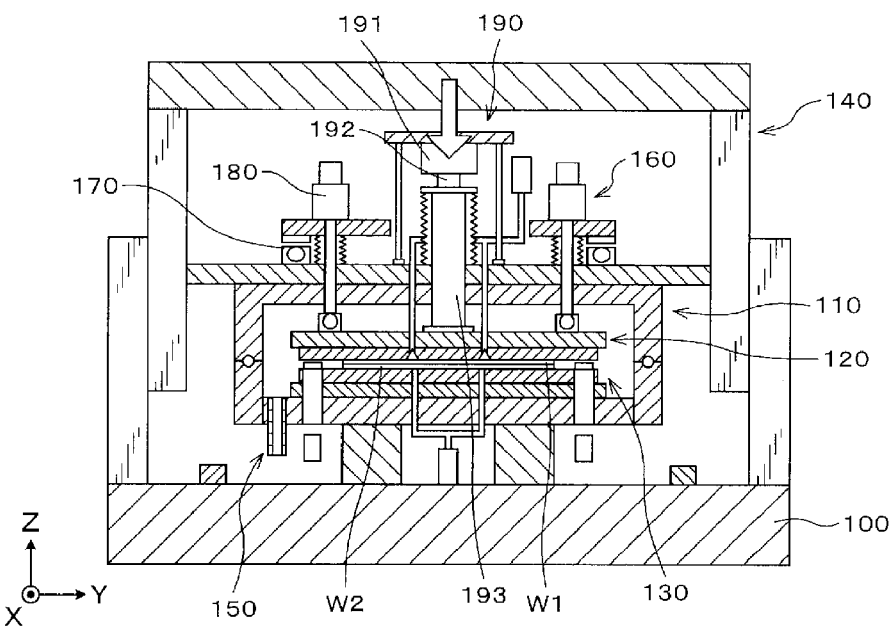
Figure 28B:
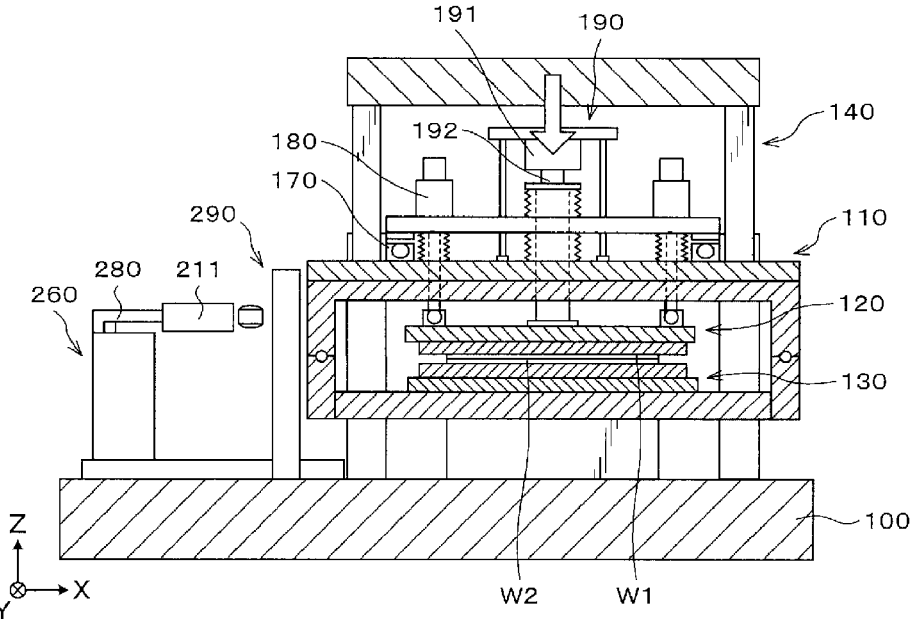

FIG. 28A and FIG. 28B are explanatory diagrams illustrating a process A14 of the bonding processing.

Figure 29:
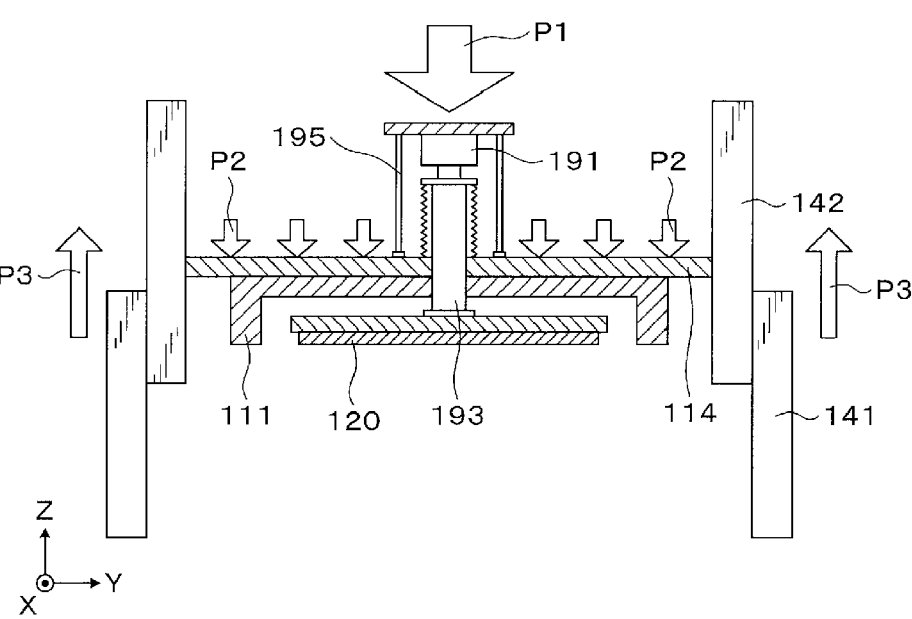

FIG. 29 is an explanatory diagram illustrating a load state at the time of pressing the first substrate and a second substrate.

Figure 30A:
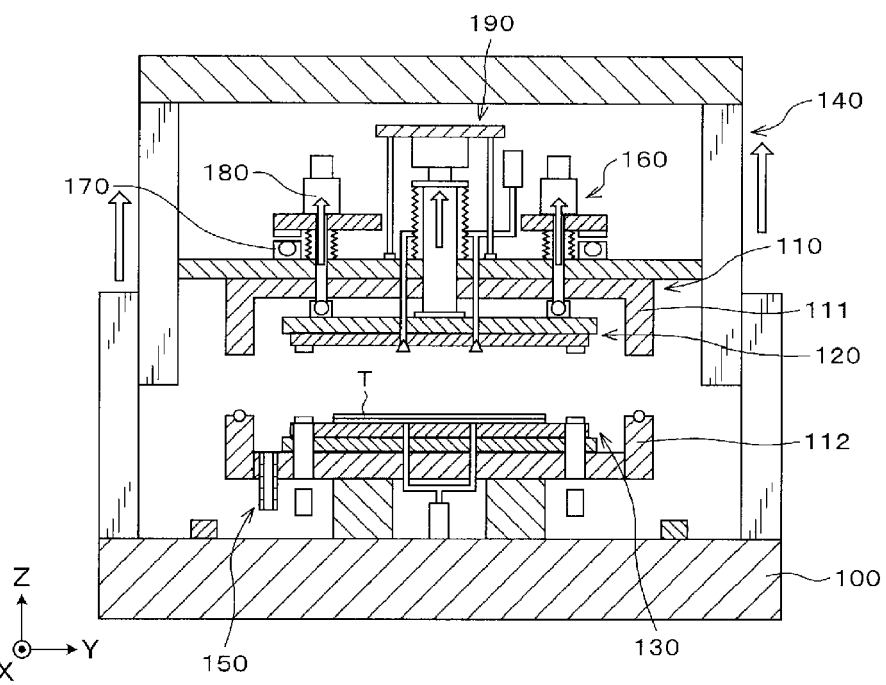
Figure 30B:
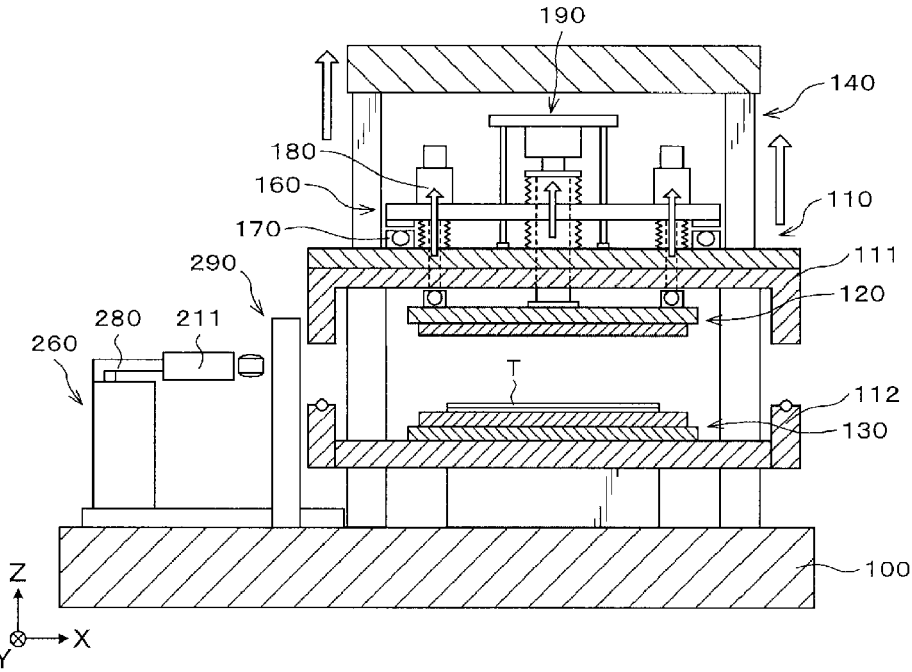

FIG. 30A and FIG. 30B are explanatory diagrams illustrating a process A15 of the bonding processing.

Figure 31A:
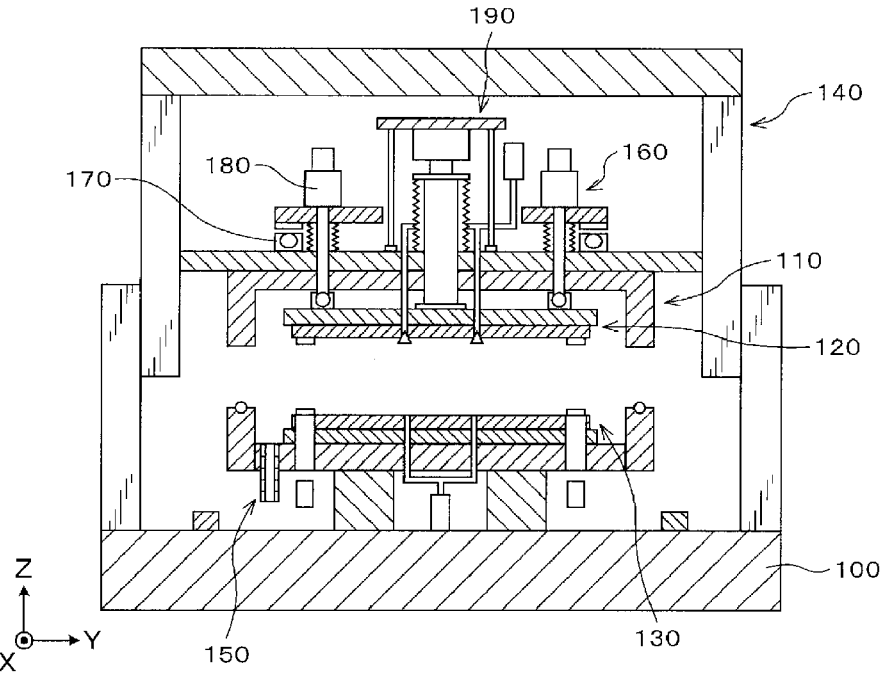
Figure 31B:
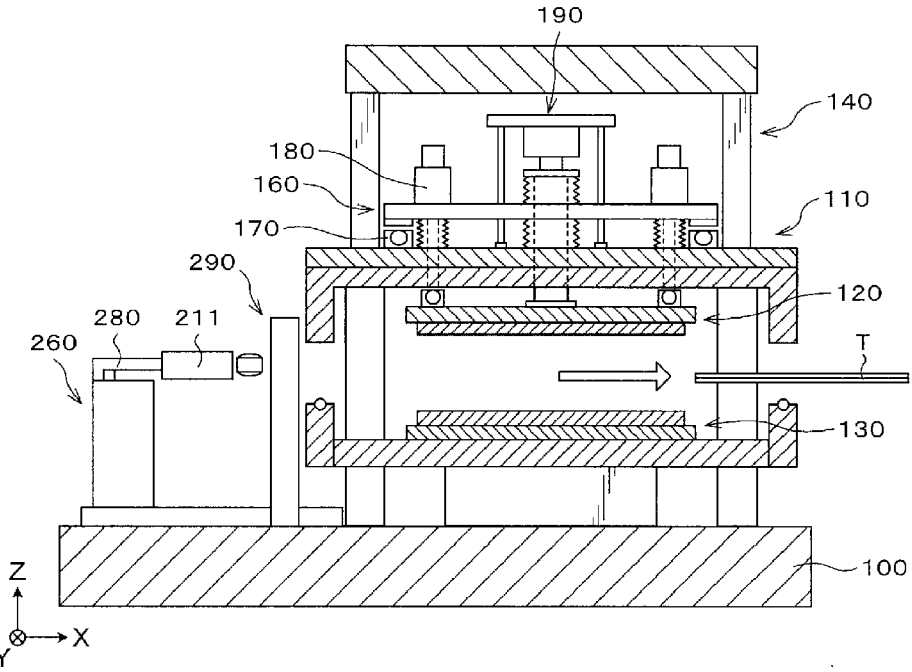

FIG. 31A and FIG. 31B are explanatory diagrams illustrating the process A15 of the bonding processing.

DETAILED DESCRIPTION

In a three-dimensional integration technology for stacking semiconductor devices three-dimensionally, bonding of two semiconductor substrates (hereinafter, simply referred to as a "substrates") is performed. Specifically, the substrates are bonded to each other by, for example, a Van der Waals force and a hydrogen bond (intermolecular force). In order to manufacture a semiconductor device properly, it becomes important to properly perform alignment between a first substrate disposed on the upper side and a second substrate disposed on the lower side when these two substrates are bonded and stacked on top of each other.

Conventionally, in the bonding apparatus disclosed in, for example, Patent Document 1, the alignment marks of the first substrate and the second substrate accommodated in the chamber are imaged by the imaging device provided outside the chamber. A position and a direction of the first holder in a horizontal direction is adjusted based on detection results of the imaged alignment marks to perform alignment between the first substrate and the second substrate.

In the bonding apparatus of Patent Document 1, however, since the imaging device is fixed in the horizontal direction, the alignment marks of the first substrate and the second substrate may not be properly imaged. In such a case, the alignment may not be properly carried out, either. In this regard, there is still a room for further improvement in terms of improving bonding accuracy.

The present disclosure provides a technique enabling to improve the bonding accuracy. Hereinafter, a bonding apparatus, a bonding system equipped with the bonding apparatus, and a bonding method according to an exemplary embodiment will be described with reference to the accompanying drawings. Further, in the present specification and the drawings, parts having substantially same functions and configurations will be assigned same reference numerals, and redundant description will be omitted.

<Configuration of Bonding System 1>

Figure 1:
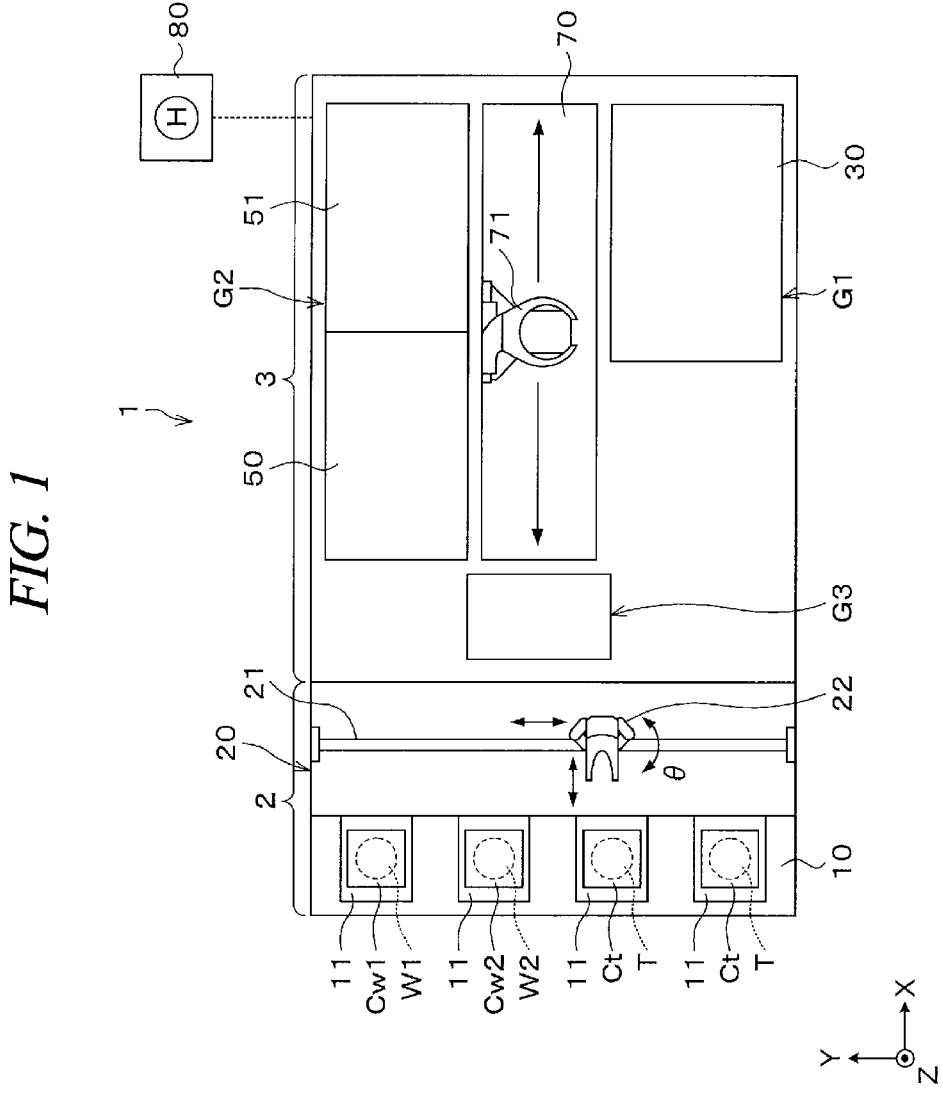
FIG. 1 is a plan view illustrating a schematic configuration of a bonding system according to an exemplary embodiment.
Figure 2:
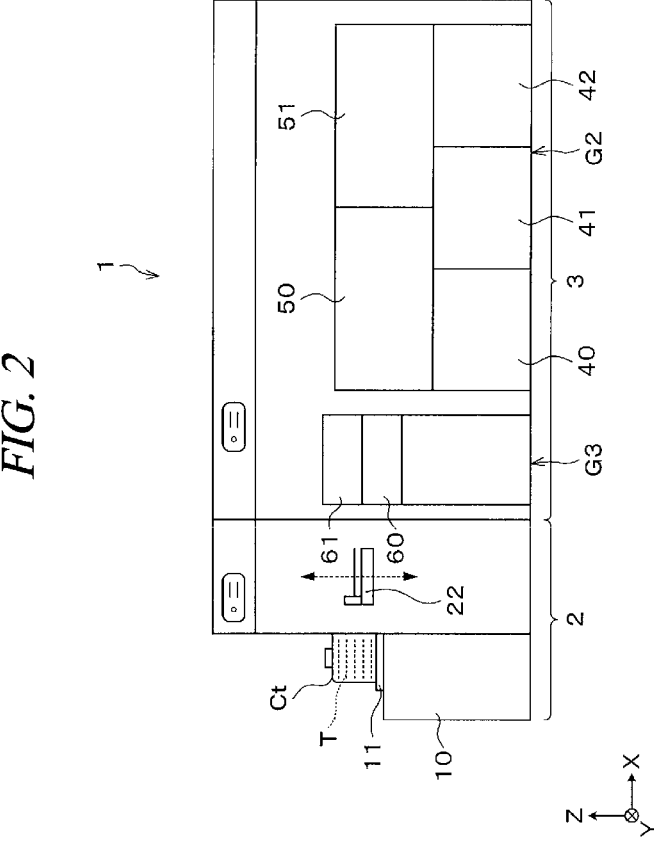
FIG. 2 is a side view illustrating the schematic configuration of the bonding system according to the exemplary embodiment.

First, a configuration of the bonding system according to the present exemplary embodiment will be described. FIG. 1 is a plan view illustrating a schematic configuration of the bonding system 1. FIG. 2 is a side view illustrating a schematic internal configuration of the bonding system 1. In the following, in order to clarify positional relationships, the X-axis direction, the Y-axis direction and the Z-axis direction which are orthogonal to each other will be defined, and the positive Z-axis direction will be regarded as a vertically upward direction.

Figure 3:
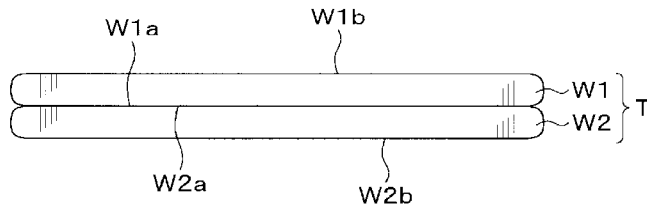
FIG. 3 is a side view illustrating a schematic structure of a combined substrate.

In the bonding system 1, a combined substrate T is formed by bonding a first substrate W1 and a second substrate W2, as shown in FIG. 3. In the first substrate W1, a surface to be bonded to the second substrate W2 will be referred to as "bonding surface W1$a$," and a surface opposite to the bonding surface W1$a$ will be referred to as "non-bonding surface W1$b$." Further, in the second substrate W2, a surface to be bonded to the first substrate W1 will be referred to as "bonding surface W2$a$," and a surface opposite to the bonding surface W2$a$ will be referred to as "non-bonding surface W2$b$." Further, each of the first substrate W1 and the second substrate W2 is, for example, a semiconductor substrate such as a silicon substrate.

Figure 4:
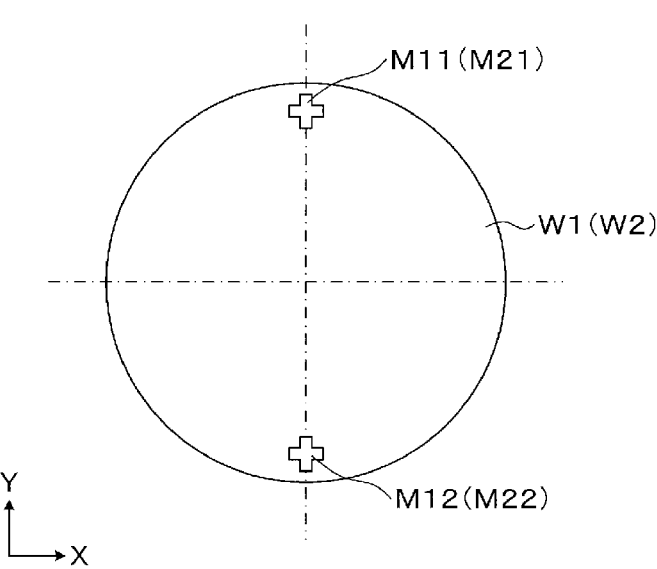
FIG. 4 is a plan view illustrating a schematic structure of a first substrate.

As depicted in FIG. 4, two first alignment marks M11 and M12 are formed on the bonding surface W1$a$ of the first substrate W1. Each of the first alignment marks M11 and M12 is formed on, for example, the Y-axis passing through a center of the first substrate W1. Further, each of the first alignment marks M11 and M12 has a cross shape. Likewise, on the bonding surface W2$a$ of the second substrate W2, two second alignment marks M21 and M22 each having a cross shape are formed on, for example, the Y axis passing through a center of the second substrate W2. In addition, the shape of the alignment marks M11, M12, M21 and M22 may be any of various shapes without being limited to the cross shape.

As shown in FIG. 1, the bonding system 1 includes a carry-in/out station 2 and a processing station 3 connected as one body. In the carry-in/out station 2, cassettes Cw1, Cw2 and Ct accommodating therein a multiple number of first substrate W1, a multiple number of second substrates W2 and a multiple number of combined substrates T, respectively, are carried to/from the outside. The processing station 3 is equipped with various kinds of processing apparatuses each configured to perform a required processing on the substrates W1, W2 and T.

The carry-in/out station 2 is provided with a cassette placing table 10. The cassette placing table 10 is equipped with a plurality of, for example, four cassette placing plates 11. The cassette placing plates 11 are arranged in a row in the Y-axis direction (up-and-down direction of FIG. 1) which is a horizontal direction. The cassettes Cw1, Cw2 and Ct can be arranged on these cassette placing plates 11 when they are carried to/from the outside of the bonding system 1. As stated, the carry-in/out station 2 is configured to be able to hold the multiple number of first substrates W1, the multiple number of second substrates W2, and the multiple number of combined substrates T. Further, the number of the cassette placing plates 11 is not limited to the example of the present exemplary embodiment, and may be selected as required. Furthermore, besides the cassettes Cw1, Cw2 and Ct, a cassette configured to collect a substrate having a problem, or the like may also be disposed on the cassette placing plate 11.

In the carry-in/out station 2, a substrate transfer section 20 is provided adjacent to the cassette placing table 10 on the positive X-axis side of the cassette placing table 10. Provided in the substrate transfer section 20 is a substrate transfer device 22 configured to be movable on a transfer path 21 extending in the Y-axis direction. The substrate transfer device 22 is also movable vertically and pivotable around a vertical axis (θ direction), and is capable of transferring the first substrates W1, the second substrates W2 and the combined substrates T between the cassettes Cw1, Cw2 and Ct on the cassette placing plates 11 and transition devices 60 and 61 of a third processing block G3 of the processing station 3 to be described later.

A plurality of, for example, three processing blocks G1, G2 and G3 each of which is equipped with various kinds of apparatuses are provided in the processing station 3. For example, the first processing block G1 is disposed on the front side (negative Y-axis side of FIG. 1) of the processing station 3, and the second processing block G2 is provided on the rear side (positive Y-axis side of FIG. 1) of the processing station 3. Further, the third processing block G3 is disposed on the carry-in/out station 2 side (negative X-axis side of FIG. 1) of the processing station 3.

A bonding apparatus 30 configured to bond the substrates W1 and W2 is disposed in the first processing block G1. A configuration of the bonding apparatus 30 will be elaborated later.

As depicted in FIG. 2, the second processing block G2 has, for example, a two-layer structure. A modifying apparatus 40, a transfer chamber 41, and a load lock chamber 42 are arranged in the lower layer of the second processing block G2 in the horizontal X-axis direction in this order from the carry-in/out station 2 side.

The modifying apparatus 40 is configured to modify the bonding surfaces W1$a$ and W2$a$ of the substrates W1 and W2. In the modifying apparatus 40, an oxygen gas or a nitrogen gas, which is a processing gas, is excited into plasma to be ionized in, for example, a decompressed atmosphere. These oxygen or nitrogen ions are radiated to the bonding surfaces W1a and W2a, so that the bonding surfaces W1a and W2a are plasma-processed to be modified.

The load lock chamber 42 is disposed adjacent to the positive Y-axis side of a substrate transfer section 70 to be described later via a gate valve (not shown). The load lock chamber 42 is configured such that an internal space thereof is switchable between an atmospheric pressure state and a vacuum state. In addition, a delivery unit (not shown) configured to deliver the first substrate W1 and the second substrate W2 is provided inside the load lock chamber 42.

The transfer chamber 41 is disposed adjacent to the negative X-axis side of the load lock chamber 42 with a gate valve (not shown) therebetween. The transfer chamber 41 is provided with a substrate transfer device (not shown) configured to transfer the first substrate W1 and the second substrate W2. The substrate transfer device may transfer the first substrate W1 and the second substrate W2 between the load lock chamber 42 and the modifying apparatus 40.

In the upper layer of the second processing block G2, hydrophilizing apparatuses 50 and 51 are arranged in the horizontal X-axis direction in this order from the carry-in/out station 2 side. The hydrophilizing apparatuses 50 and 51 are respectively configured to hydrophilize the bonding surfaces W1a and W2a of the substrates W1 and W2 with, for example, pure water, and also clean the bonding surfaces W1a and W2a. In the hydrophilizing apparatus 50, while rotating the substrates W1 and W2 held by, for example, a spin chuck (not shown), the pure water is supplied onto the substrates W1 and W2. Then, the supplied pure water is diffused on the bonding surfaces W1a and W2a of the substrates W1 and W2, and the bonding surfaces W1a and W2a are hydrophilized.

In the third processing block G3, the transition devices 60 and 61 for the first substrates W1, the second substrates W2, and the combined substrates T are arranged in two levels in sequence from the bottom.

As shown in FIG. 1, the substrate transfer section 70 is formed in a region surrounded by the first to third processing blocks G1 to G3. The substrate transfer section 70 is provided with, for example, a substrate transfer device 71.

The substrate transfer device 71 has, for example, a transfer arm which is movable vertically and horizontally (both in the X-axis direction and the Y-axis direction) and pivotable around a vertical axis. The substrate transfer device 71 moves within the substrate transfer section 70 to transfer the first substrates W1, the second substrates W2, and the combined substrates T to required apparatuses in the first to third processing blocks G1 to G3 nearby.

The above-described bonding system 1 includes a control device 80 as a controller. The control device 80 may be, for example, a computer and has a program storage (not shown). The program storage stores therein a program for controlling a substrate processing in the bonding system 1. Further, the program storage also stores therein a program for implementing the substrate processing to be described later in the bonding system 1 by controlling operations of the above-described various kinds of processing apparatuses and a driving system such as the transfer devices. Furthermore, the program may be recorded on a computer-readable recording medium H and installed from the recording medium H to the control device 80.

<Configuration of Bonding Apparatus 30>

Now, the configuration of the bonding apparatus 30 will be elaborated. FIG. 5 and FIG. 6 are side views schematically illustrating the configuration of the bonding apparatus 30. FIG. 7 is a plan view schematically illustrating the bonding apparatus 30.

The bonding apparatus 30 has a structure in which various members are mounted on a base 100. Specifically, the bonding apparatus 30 includes a processing vessel 110, a first holder 120, and a second holder 130. Further, the bonding apparatus 30 also includes, near the processing vessel 110, a chamber elevating mechanism 140 and a decompressing unit 150. In addition, the bonding apparatus 30 includes, near the first holder 120, a support 160, a horizontal position adjuster 170, a vertical position adjuster 180, and a pressing unit 190. Moreover, the bonding apparatus 30 further includes fixed imaging devices 200 and 201 near the second holder 130. Additionally, the bonding apparatus 30 is equipped with imaging units 210 and 211 configured to be moved between the inside and the outside of the processing vessel 110. Below, the individual components will be explained.

(Configuration of Processing Vessel 110 and the Vicinity Thereof)

First, a configuration of the processing vessel 110 and the vicinity thereof will be described.

The processing vessel 110 is a container having a sealable inside, and accommodates therein the first holder 120 and the second holder 130. The processing vessel 110 is divided into two: a first chamber 111 on the first holder 120 side (upper side) and a second chamber 112 on the second holder 130 side (lower side). A seal member 113 for maintaining airtightness of the inside of the processing vessel 110 is provided on a joint surface of the second chamber 112 to be brought into contact with the first chamber 111. The seal member 113 may be, for example, an O-ring. Then, by bringing the first chamber 111 and the second chamber 112 into contact with each other, a sealed space is formed within the processing vessel 110.

The first chamber 111 is supported by a supporting plate 114 provided on a top surface of the first chamber 111. Further, the supporting plate 114 is supported by chamber elevating mechanisms 140. Each chamber elevating mechanism 140 has a supporting column 141 and an elevating member 142. The supporting columns 141 and the elevating members 142 are respectively provided at, for example, four different positions at an outer edge of the supporting plate 114. Each supporting column 141 extends vertically upwards from the base 100. Each elevating member 142 supports the outer edge of the supporting plate 114, and a base end of the elevating member 142 is fastened to the supporting column 141. The elevating member 142 is moved up and down along the supporting column 141 by, for example, a driving unit (not shown) having, for example, a motor. The first chamber 111 is configured to be moved up and down by the chamber elevating mechanism 140 having the above-described configuration. Further, leading ends of the four elevating members 142 are supported by a ceiling plate 143.

In addition, in the present exemplary embodiment, although the four chamber elevating mechanisms 140 are provided at the outer edge of the supporting plate 114, the number of the chamber elevating mechanisms 140 is not limited thereto. By way of example, when supporting the outer edge of the supporting plate 114 at four different positions, the chamber elevating mechanisms 140 may be provided at two of the four positions, and extensible/contractible shafts may be provided at the other two positions.

The second chamber 112 is supported on a supporting table 115 which is provided on the base 100. That is, the second chamber 112 does not move, but is fixed. The supporting table 115 is hollow. In addition, the second chamber 112 is equipped with the decompressing unit 150 which is configured to decompress the inside of the processing vessel 110. The decompressing unit 150 includes an intake pipe 151 for sucking in an atmosphere within the processing vessel 110; and an intake device 152 such as, but not limited to, a vacuum pump connected to the intake pipe 151.

(Configuration of First Holder 120 and the Vicinity Thereof)

Now, a configuration of the first holder 120 and the vicinity thereof will be explained. FIG. 8 is a cross sectional view illustrating the configuration of the first holder 120 and the vicinity thereof. FIG. 9 is a plan view of the first holder 120 and the vicinity thereof seen from below. FIG. 10 is a plan view of the first holder 120 and the vicinity thereof seen from above.

The first holder 120 is a holder configured to hold the first substrate W1. The first holder 120 includes an electrostatic chuck 121 and a cooling plate 122. The electrostatic chuck 121 has an internal electrode and a dielectric material, and is configured to attract the first substrate W1 onto an attraction surface thereof with an electrostatic force generated by applying a voltage to the internal electrode. The cooling plate 122 is, for example, a water cooling plate, and cooling water flows therein. The first substrate W1 held on the electrostatic chuck 121 is regulated to a required temperature, for example, a room temperature by the cooling plate 122.

On a bottom surface of the first holder 120, two first chuck marks N11 and N12 are formed as first holding marks. Each of the first chuck marks N11 and N12 is formed on, for example, the Y-axis passing through a center of the electrostatic chuck 121 at an outer periphery of a bottom surface of the electrostatic chuck 121. In addition, each of the first chuck marks N11 and N12 has a cross shape. However, the shape of the first chuck marks N11 and N12 is not limited to the cross shape, and it can be any of various shapes.

An attraction pad 123 configured to attract and hold the first substrate W1 is provided on the bottom surface of the electrostatic chuck 121. The attraction pad 123 is plural in number, and these multiple attraction pads 123 may be provided at, for example, three different positions. Each attraction pad 123 communicates with a suction mechanism 126 for suctioning the first substrate W1 via a suction pipe 125 which is inserted through a through hole 124 formed through the electrostatic chuck 121 and the cooling plate 122. Further, the attraction pads 123 and the suction pipe 125 are configured to be moved up and down by the suction mechanism 126.

The first holder 120 is supported by the support 160 so as to be suspended from above. The support 160 allows the first holder 120 to be disposed with a gap with respect to the first chamber 111. The support 160 has a moving plate 161 and transmission shafts 162. The moving plate 161 is disposed above the supporting plate 114 at the outside of the processing vessel 110. A central portion of the moving plate 161 is opened, so the moving plate 161 has an annular shape.

On a bottom surface of the moving plate 161, the transmission shafts 162 are disposed at three locations on a circle concentric with the moving plate 161 at a substantially regular distance therebetween. Each transmission shaft 162 extends vertically downwards from the moving plate 161 and penetrates the supporting plate 114 and the first chamber 111 to be connected to a top surface of the cooling plate 122 of the first holder 120.

A bellows 163 covering the transmission shaft 162 is provided on an outer surface of the transmission shaft 162. An upper end of the bellows 163 is connected to the bottom surface of the moving plate 161, and a lower end of the bellows 163 is connected to a top surface of the supporting plate 114. The first holder 120 provided inside the processing vessel 110 can be moved from the outside of the processing vessel 110 while ensuring airtightness of the processing vessel 110 with the bellows 163.

Further, a through hole 164 is formed through the supporting plate 114 and the first chamber 111, and the transmission shaft 162 is inserted through the through hole 164. Further, since the transmission shaft 162 is moved horizontally by the horizontal position adjuster 170 as will be described later, an inner diameter of the through hole 164 is sufficiently larger than an outer diameter of the transmission shaft 162.

The horizontal position adjuster 170 is provided between the bottom surface of the moving plate 161 and the top surface of the supporting plate 114. That is, the horizontal position adjuster 170 is provided outside the processing vessel 110. The horizontal position adjuster 170 is provided at each of, for example, three locations on a circle concentric with the moving plate 161 at a substantially regular distance therebetween.

A UVW stage having, for example, the U-axis, the V-axis, and the W-axis as driving axes serves as the horizontal position adjuster 170. In this case, the moving plate 161 may be moved in the X-axis direction, the Y-axis direction, and the θ-axis direction by the horizontal position adjuster 170. Then, the horizontal movement of the moving plate 161 is transmitted to the first holder 120 via the transmission shafts 162, so that a horizontal position of the first holder 120 is adjusted. Here, the horizontal position refers to a position in the X-axis direction, the Y-axis direction, and the θ-axis direction as described above, that is, a position and a direction in the horizontal direction.

In addition, a commonly-known stage serves as the UVW stage of the horizontal position adjuster 170. However, the configuration of the horizontal position adjuster 170 is not limited thereto. By way of example, an XYθ stage having the X-axis, the Y-axis and the θ-axis as driving axes may be used, or 4-axis stage, which has four driving axes of X1, X2, Y1 and Y2 and performs XYθ-driving in one plane, may be used.

A vertical position adjuster 180 is provided on the top surface of the moving plate 161. That is, the vertical position adjuster 180 is provided outside the processing vessel 110. The vertical position adjuster 180 may be disposed at each of, for example, three locations on a circle concentric with the moving plate 161 at a substantially regular distance therebetween.

The vertical position adjuster 180 is provided with a driving unit (not shown) having, for example, a motor or the like. The vertical position adjuster 180 is connected to the transmission shaft 162 and moves the transmission shaft 162 up and down. Then, the vertical movement of the transmission shaft 162 is transmitted to the first holder 120, so that the position of the first holder 120 in the vertical direction is adjusted. Moreover, the tilt (degree of horizontality) of the first holder 120 is adjusted by moving the first holder 120 up and down with the three vertical position adjusters 180.

The pressing unit 190 is inserted through the opening at the center of the moving plate 161. That is, the pressing unit 190 is provided outside the processing vessel 110. The pressing unit 190 has a pressing mechanism 191, a measuring mechanism 192, and a press rod 193. The pressing mechanism 191, the measuring mechanism 192 and the press rod 193 are disposed in this order from above.

For example, a hydraulic cylinder serves as the pressing mechanism 191. If the hydraulic cylinder is used, space-saving can be achieved in the apparatus configuration. Further, the configuration of the pressing mechanism 191 is not limited to the hydraulic cylinder, and an air cylinder (pneumatic cylinder), for example, may be used.

The pressing mechanism 191 is supported by a supporting plate 194 provided on a top surface of the pressing mechanism 191. The supporting plate 194 is supported by a plurality of, for example, three supporting columns 195 provided on a bottom surface of the supporting plate 194. Upper ends of the supporting columns 195 are connected to the bottom surface of the supporting plate 194, and lower ends of the supporting columns 195 are connected to the top surface of the supporting plate 114. The supporting plate 194 has a substantially triangular shape when viewed from the top. The three supporting columns 195 are respectively provided at apex portions of the supporting plate 194.

The measuring mechanism 192 may be, for example, a load cell. The measuring mechanism 192 is provided between the pressing mechanism 191 and a flange 196 provided on an upper end of the press rod 193. In the measuring mechanism 192, when the first substrate W1 and the second substrate W2 are pressed by using the pressing mechanism 191, a load applied to the first and second substrates W1 and W2 is measured. A measurement result of the measuring mechanism 192 is outputted to the control device 80.

The press rod 193 extends vertically downwards from the flange 196 and penetrates the supporting plate 114 and the first chamber 111 to be connected to a central portion of the top surface of the cooling plate 122 of the first holder 120. Further, a through hole 197 is formed through the supporting plate 114 and the first chamber 111, and the press rod 193 is inserted through the through hole 197.

A bellows 198 covering the press rod 193 is provided on an outer surface of the press rod 193. An upper end of the bellows 198 is connected to a bottom surface of the flange 196, and a lower end of the bellows 198 is connected to the top surface of the supporting plate 114. The first holder 120 provided inside the processing vessel 110 can be pressed from the outside of the processing vessel 110 while ensuring the airtightness of the processing vessel 110 with the bellows 198.

The pressing unit 190 is configured as described above, and it serves to move the press rod 193 vertically by using the pressing mechanism 191. Accordingly, the first holder 120 approaches the second holder 130, allowing the first substrate W1 held by the first holder 120 to be pressed against the second substrate W2 held by the second holder 130. At this time, the load applied to the first substrate W1 and the second substrate W2 is measured by using the measuring mechanism 192.

(Configuration of Second Holder 130 and the Vicinity Thereof)

Now, a configuration of the second holder 130 and the vicinity thereof will be explained. FIG. 11 and FIG. 12 are cross sectional views illustrating the configuration of the second holder 130 and the vicinity thereof. FIG. 13 is a plan view of the second holder 130 and the vicinity thereof seen from above.

The second holder 130 is a holder configured to hold the second substrate W2. The second holder 130 is disposed to face the first holder 120 in the vertical direction, and is provided at a central portion of the second chamber 112.

Further, the intake pipe 151 of the decompressing unit 150 described above is connected to the second chamber 112 at the outside of the second holder 130 when viewed from the top.

The second holder 130 includes an electrostatic chuck 131 and a cooling plate 132. The electrostatic chuck 131 has an internal electrode and a dielectric material, and is configured to attract the second substrate W2 onto an attraction surface thereof with an electrostatic force generated by applying a voltage to the internal electrode. The cooling plate 132 is, for example, a water cooling plate, and cooling water flows therein. The second substrate W2 held on the electrostatic chuck 131 is regulated to a required temperature, for example, a room temperature by the cooling plate 132. The electrostatic chuck 131 and the cooling plate 132 have the same configurations as the electrostatic chuck 121 and the cooling plate 122 of the first holder 120, respectively.

On a top surface of the second holder 130, two second chuck marks N21 and N22 are formed as second holding marks. Each of the second chuck marks N21 and N22 is formed on, for example, the Y-axis passing through a center of the electrostatic chuck 131 at an outer periphery of a top surface of the electrostatic chuck 131. Further, each of the second chuck marks N21 and N22 has a cross shape. In addition, the second chuck marks N21 and N22 are disposed to face the first chuck marks N11 and N12 formed on the first holder 120, respectively. Here, however, the shape of the second chuck marks N21 and N22 is not limited to the cross shape, and it can be any of various shapes.

The second holder 130 is provided with, for example, three elevating pins 133 configured to move the second substrate W2 (or the combined substrate T) up and down from below. The elevating pins 133 are inserted through holes 134 that are formed through the electrostatic chuck 131, the cooling plate 132, and the second chamber 112. The elevating pins 133 are configured to be moved up and down by an elevating mechanism 135 provided within the supporting table 115.

Under the second holder 130 and the second chamber 112, the two fixed imaging devices 200 and 201, for example, are provided. A camera may serve as each of the imaging devices 200 and 201.

The first imaging device 200 is disposed at a position facing the first chuck mark N11 and the second chuck mark N21. Further, a first viewport 202 is formed through the electrostatic chuck 131, the cooling plate 132 and the second chamber 112 between the first imaging device 200 and the second chuck mark N21. The first viewport 202 is formed of, for example, quartz glass. The first viewport 202 enables to maintain the airtightness of the processing vessel 110 without interfering with imaging by the first imaging device 200. With this configuration, the first imaging device 200 can image the second chuck mark N21 and the first chuck mark N11 through the first viewport 202. Further, the first chuck mark N11 is imaged through the second chuck mark N21. An image obtained by the first imaging device 200 is outputted to the control device 80.

The second imaging device 201 and the vicinity thereof have the same configuration as the first imaging device 200. That is, the second imaging device 201 is disposed at a position facing the first chuck mark N12 and the second chuck mark N22, and a second viewport 203 is formed through the electrostatic chuck 131, the cooling plate 132, and the second chamber 112. The second imaging device 201 can image the second chuck mark N22 and the first chuck mark N12 through the second viewport 203. An image obtained by the second imaging device 201 is outputted to the control device 80.

The second chamber 112 is equipped with a displacement meter 204. A laser displacement meter may be used as the displacement meter 204. The displacement meter 204 is provided at each of multiple locations, for example, three locations, in a peripheral portion of a bottom surface of the second holder 130.

A viewport 205 is formed through the electrostatic chuck 131, the cooling plate 132 and the second chamber 112 to correspond to the displacement meter 204. The viewport 205 is formed of, for example, quartz glass. This viewport 205 enables to maintain the airtightness of the processing vessel 110 without interfering with an optical path of laser light of the displacement meter 204.

With this configuration, the displacement meter 204 may radiate laser light to the bottom surface of the electrostatic chuck 121 of the first holder 120 through the viewport 205, and may receive reflection light from the electrostatic chuck 121. In addition, the displacement meter 204 may measure a distance between the first holder 120 and the second holder 130. Furthermore, by using the three displacement meters 204, an inclination of the first holder 120 can also be measured. A measurement result of the displacement meter 204 is outputted to the control device 80.

Additionally, since the displacement meter 204 is not disposed within the processing vessel 110, it does not need to be vacuum-compatible. Thus, an inexpensive displacement meter that can be used in the atmospheric environment may be used as the displacement meter 204.

(Configuration of Imaging Units 210 and 211 and the Vicinity Thereof)

Now, a configuration of the imaging units 210 and 211 and the vicinity thereof will be explained. As depicted in FIG. 5 to FIG. 7, the two imaging units 210 and 211 are configured to be moved between the inside and the outside of the processing vessel 110.

FIG. 14 is a plan view schematically showing the configuration of the first imaging unit 210. FIG. 15 is a side view schematically showing the configuration of the first imaging unit 210. FIG. 16A to FIG. 16C are explanatory diagrams schematically showing an internal configuration of the first imaging unit 210. In FIG. 16A to FIG. 16C, solid-lined arrows indicate imaging paths (a first imaging path Q1 and a second imaging path Q2) from cameras, and dotted-lined arrows indicate optical paths (a first optical path R1 and a second optical path R2) from light sources.

The first imaging unit 210 includes a first imaging device 220, a second imaging device 230, and a common lens unit 240.

The first imaging device 220 includes a first camera 221, a first light source 222, a first lens 223, and a first path changer 224. Reflection mirrors 222a and 223a configured to change the first optical path R1 from the first light source 222 are provided inside the first light source 222 and the first lens 223, respectively. A reflection mirror 224a configured to change the first imaging path Q1 of the first camera 221 and the first optical path R1 is provided inside the first path changer 224.

The second imaging device 230 also has the same configuration as the first imaging device 220. That is, the second imaging device 230 has a second camera 231, a second light source 232, a second lens 233, and a second path changer 234.

The common lens unit 240 includes an upper lens 241, a lower lens 242, and a reflection mirror 243. The reflection mirror 243 is inclined at an angle of 45 degrees when viewed from the side. Directions of the first imaging path Q1 from the first imaging device 220 and the first optical path R1 are changed vertically upwards, and are directed vertically upwards from the upper lens 241. Further, directions of the second imaging path Q2 from the second imaging device 230 and the second optical path R2 are changed vertically downwards, and are directed vertically downwards from the lower lens 242. Further, the first imaging path Q1 (first optical path R1) and the second imaging path Q2 (second optical path R2) extend coaxially in the vertical direction.

The first imaging unit 210 having the above-described configuration performs imaging of the first alignment mark M11 by the first imaging device 220 and imaging of the second alignment mark M21 by the second imaging device 230 simultaneously, as will be described later. Further, the first imaging unit 210 also performs imaging of the first chuck mark N11 by the first imaging device 220 and imaging of the second chuck mark N21 by the second imaging device 230 simultaneously. Images obtained by the first imaging unit 210 are outputted to the control device 80.

Here, advantages of the first imaging unit 210 will be described in comparison with a conventional imaging unit. FIG. 17 is an explanatory diagram schematically illustrating an internal configuration of a conventional imaging unit 500. When designed to perform imaging vertically upwards and vertically downwards simultaneously, the conventional imaging unit 500 is equipped with a first imaging device 510 configured to perform imaging vertically upwards and a second imaging device 520 configured to perform imaging vertically downwards that are vertically arranged. A first camera 511 of the first imaging device 510 has a focus axis, and a first lens 512 is provided on a first path changer 513. A second camera 521 of the second imaging device 520 has a focus axis, and a second lens 522 is provided under a second path changer 523. In this configuration, a vertical distance L2 between the first substrate W1 and the second substrate W2 is, for example, 220 mm, which is very long.

In contrast, since the first imaging unit 210 of the present exemplary embodiment has the common lens unit 240, a vertical distance L1 between the first substrate W1 and the second substrate W2 can be shortened to, e.g., 110 mm, as shown in FIG. 16B. As will be described later, although the imaging by the first imaging unit 210 is performed while keeping the processing vessel 110 open, a distance between the first chamber 111 and the second chamber 112 spaced apart from each other may be set to be small at this time. Accordingly, when lowering the first chamber 111 later to seal the processing vessel 110, a moving distance can be reduced. As a result, a position deviation between the first substrate W1 and the second substrate W2 can be suppressed. Furthermore, a processing time may be shortened.

In addition, the first imaging device 220, the second imaging device 230, and the common lens unit 240 are supported on a supporting plate 250, and a part of the first imaging device 220 and a part of the second imaging device 230 are covered with a cover 251.

The second imaging unit 211 has the same configuration as the first imaging unit 210. That is, the second imaging unit 211 is equipped with a first imaging device 220, a second imaging device 230, and a common lens unit 240.

However, the first imaging unit 210 is further provided with displacement meters 252 and 253. Each of the displacement meters 252 and 253 may be a laser displacement meter. The displacement meter 252 on the upper side measures a thickness of the upper side, for example, the first substrate W1, and the displacement meter 253 on the lower side measures a thickness of the lower side, for example, the second substrate W2.

As depicted in FIG. 5 to FIG. 7, the bonding apparatus 30 is equipped with a first moving mechanism 260, a second moving mechanism 270, and a third moving mechanism 280 which are configured to move the imaging units 210 and 211.

The first moving mechanism 260 moves the two imaging units 210 and 211 in the X-axis direction (first direction) in a planar region between the first holder 120 and the second holder 130. The first moving mechanism 260 supports the two imaging units 210 and 211 and has a door-shaped moving frame 261 extending in the Y-axis direction when viewed from the top. Further, a pair of rails 262 extending from the negative X-axis side to the positive X-axis side of the processing vessel 110 are provided on the base 100. The moving frame 261 is mounted to the pair of rails 262. Further, the moving frame 261 is provided with a driving unit (not shown) having, for example, a motor, and the moving frame 261 is configured to be moved along the rails 262 extending along the X-axis.

The second moving mechanism 270 moves the first imaging unit 210 along the Y-axis direction (second direction). The second moving mechanism 270 supports the first imaging unit 210 and is mounted on a top surface of the moving frame 261. The second moving mechanism 270 has a driving unit such as, but not limited to, a motor embedded therein, and is configured to be movable along the moving frame 261.

The third moving mechanism 280 moves the second imaging unit 211 along the Y-axis direction (second direction). The third moving mechanism 280 supports the second imaging unit 211 and is mounted on the top surface of the moving frame 261. The third moving mechanism 280 has a driving unit such as, but not limited to, a motor embedded therein, and is configured to be movable along the moving frame 261.

A reference mark unit 290 is provided on the negative X-axis side of the processing vessel 110. FIG. 18 is a side view illustrating a schematic configuration of the reference mark unit 290. The reference mark unit 290 includes a first reference mark supporting body 291 and second reference mark supporting bodies 292.

The first reference mark supporting body 291 is provided on the base 100 and has a door-shaped frame structure extending in the Y-axis direction. The first reference mark supporting body 291 is formed to be larger than the moving frame 261, and the moving frame 261 passes through the inside of the first reference mark supporting body 291.

Formed on a bottom surface of the first reference mark supporting body 291 are, for example, three first reference marks S11, S12 and S13. When the imaging units 210 and 211 supported by the moving frame 261 pass by the first reference mark supporting body 291, the first imaging device 220 of each of the imaging units 210 and 211 images any one of the first reference marks S11, S12 and S13. Images obtained by the first imaging devices 220 are sent to the control device 80. Further, although the three first reference marks S11, S12 and S13 are provided in the present exemplary embodiment, the number of the first reference marks required for the first imaging devices 220 of the imaging units 210 and 211 to perform the imaging only needs to be equal to or larger than one.

The second reference mark supporting bodies 292 extend vertically upwards on the base 100. For example, three second reference mark supporting bodies 292 are provided under the first reference marks S11, S12 and S13, respectively. The second reference mark supporting bodies 292 are provided inside the moving frame 261, and the moving frame 261 passes through a space above the second reference mark supporting body 292.

Second reference marks S21, S22 and S23 are respectively formed on top surfaces of the three second reference mark supporting bodies 292. That is, the second reference marks S21, S22 and S23 are arranged to face the first reference marks S11, S12 and S13, respectively. When the imaging units 210 and 211 supported by the moving frame 261 pass by the second reference mark supporting bodies 292, the second imaging device 230 of each of the imaging units 210 and 211 images any one of the second reference marks S21, S22 and S23. Images obtained by the second imaging devices 230 are outputted to the control device 80.

Moreover, the imaging of the first reference marks S11, S12 and S13 by the first imaging devices 220 and the imaging of the second reference marks S21, S22 and S23 by the second imaging devices 230 are carried out at the same time. Further, as will be described later, a posture (direction) of the imaging units 210 and 211 is adjusted based on the obtained images of the reference marks.

<Operation of Bonding System 1>

Now, a bonding processing for the substrates W1 and W2 performed by using the bonding system 1 configured as described above will be described. FIG. 19 is a flowchart illustrating main processes of a substrate bonding processing.

First, the cassette Cw1 accommodating therein the multiple number of first substrates W1, the cassette Cw2 accommodating therein the multiple number of second substrates W2, and the empty cassette Ct are placed on the required cassette placing plates 11 of the carry-in/out station 2. Then, the first substrate W1 is taken out of the cassette Cw1 by the substrate transfer device 22, and transferred into the transition device 60 of the third processing block G3 of the processing station 3.

Subsequently, the first substrate W1 is transferred into the load lock chamber 42 of the second processing block G2 by the substrate transfer device 71. Then, the inside of the load lock chamber 42 is sealed and decompressed. Thereafter, the first substrate W1 is transferred into the modifying apparatus 40 by the substrate transfer device of the transfer chamber 41.

In the modifying apparatus 40, the oxygen gas or the nitrogen gas, which is the processing gas, is excited into plasma to be ionized under a required decompressed atmosphere. Oxygen ions or nitrogen ions are radiated to the bonding surface W1a of the first substrate W1, so that the bonding surface W1a is plasma-processed. As a result, the bonding surface W1a of the first substrate W1 is modified (process A1 of FIG. 19).

Then, the first substrate W1 is transferred into the load lock chamber 42 by the substrate transfer device of the transfer chamber 41. Thereafter, the inside of the load lock chamber 42 is sealed and opened to the atmosphere. Next, the first substrate W1 is transferred into the hydrophilizing apparatus 50 by the substrate transfer device 71.

In the hydrophilizing apparatus 50, pure water is supplied onto the first substrate W1 while rotating the first substrate W1 held by the spin chuck. The supplied pure water is diffused on the bonding surface W1a of the first substrate W1, and a hydroxyl group (silanol group) adheres to the bonding surface W1a of the first substrate W1 modified in the modifying apparatus 40, so that the bonding surface W1a is hydrophilized. Further, the bonding surface W1a of the first substrate W1 is cleaned by the pure water (process A2 of FIG. 19).

Subsequently, by adjusting a position of an orientation flat or a notch, a direction of the first substrate W1 in the horizontal direction is adjusted. Further, a front surface and a rear surface of the first substrate W1 are inverted, rendering the bonding surface W1a of the first substrate W1 face downward. This horizontal direction adjustment and the front-rear inversion of the first substrate W1 are performed by an apparatus (not shown) provided in the bonding system 1.

Next, the first substrate W1 is transferred into the bonding apparatus 30 of the first processing block G1 by the substrate transfer device 71. At this time, the first chamber 111 and the second chamber 112 are spaced apart from each other, and the processing vessel 110 is opened. With the bonding surface W1a of the first substrate W1 facing downwards, the first substrate W1 is delivered onto the attraction pad 123 which is standing by below the electrostatic chuck 121 of the first holder 120 in advance. Next, the attraction pad 123 is raised, and the first substrate W1 is attracted to and held by the electrostatic chuck 121, as shown in FIG. 20A and FIG. 20B (process A3 of FIG. 19).

While the processing of the processes A1 to A3 described above is being performed on the first substrate W1, processing of the second substrate W2 is performed, following the first substrate W1. First, the second substrate W2 is taken out of the cassette Cw2 by the substrate transfer device 22 and transferred into the transition device 60 of the processing station 3.

Then, the second substrate W2 is transferred into the load lock chamber 42 by the substrate transfer device 71, and is then transferred into the modifying apparatus 40 by the substrate transfer device of the transfer chamber 41. In the modifying apparatus 40, the bonding surface W2a of the second substrate W2 is modified (process A4 of FIG. 19). The modification of the bonding surface W2a of the second substrate W2 in the process A4 is the same as that of the process A1 described above.

Subsequently, the second substrate W2 is transferred into the load lock chamber 42 by the substrate transfer device of the transfer chamber 41, and is then transferred into the hydrophilizing apparatus 50 by the substrate transfer device 71. In the hydrophilizing apparatus 50, the bonding surface W2a of the second substrate W2 is hydrophilized and also cleaned (process A5 of FIG. 19). The hydrophilizing and the cleaning of the bonding surface W2a of the second substrate W2 in the process A5 are the same as those of the process A2 stated above.

Thereafter, by adjusting a position of an orientation flat or a notch, a direction of the second substrate W2 in the horizontal direction is adjusted. This horizontal direction adjustment of the second substrate W2 are performed by an apparatus (not shown) provided in the bonding system 1.

Subsequently, the second substrate W2 is transferred into the bonding apparatus 30 by the substrate transfer device 71. With the bonding surface W2a of the second substrate W2 facing upwards, the second substrate W2 is delivered onto the elevating pins 133 which are standing by above the electrostatic chuck 131 of the second holder 130 in advance. Next, the elevating pins 133 are lowered, and the second substrate W2 is attracted to and held by the electrostatic chuck 131, as shown in FIG. 20A and FIG. 20B (process A6 of FIG. 19).

Then, the posture (direction) of the first and second imaging units 210 and 211 are adjusted (process A7 of FIG. 19).

In the process A7, as shown in FIG. 21A and FIG. 21B, the imaging units 210 and 211 which are standing by at the outside of the processing vessel 110 are moved to the position of the reference mark unit 290 by the first moving mechanism 260 in the positive X-axis direction. In the reference mark unit 290, the first imaging device 220 of the first imaging unit 210 images the first reference mark S11, and, at the same time, the second imaging device 230 thereof images the second reference mark S21. The image obtained by the first imaging unit 210 is outputted to the control device 80. In the control device 80, by performing edge detection on the acquired images, the first reference mark S11 and the second reference mark S21 are detected. An adjusting mechanism (not shown) of the first imaging unit 210 is controlled such that the first reference mark S11 and the second reference mark S21 are matched. The posture (direction) of the first imaging unit 210 is adjusted by the adjusting mechanism.

Further, in the process A7, the posture (direction) of the second imaging unit 211 is adjusted in the same way as in the adjustment of the first imaging unit 210. By adjusting the postures of the imaging units 210 and 211 as described above, imaging precision by the imaging units 210 and 211 can be improved. As a result, adjustment precision (alignment precision) of the horizontal positions of the first and second substrates W1 and W2 in a process A9 to be described later can be improved.

Then, the thicknesses of the first substrate W1 and the second substrate W2 are measured (process A8 of FIG. 19).

In the process A8, the imaging units 210 and 211 are further moved in the positive X-axis direction to be placed within the processing vessel 110, as shown in FIG. 21A and FIG. 21B. Inside the processing vessel 110, while moving the first imaging unit 210 in the X-axis direction from one ends to the other ends of the substrates W1 and W2, the thickness of the first substrate W1 and the thickness of the second substrate W2 are measured by using the displacement meters 252 and 253, respectively. Measurement results of the displacement meters 252 and 253 are outputted to the control device 80. In the control device 80, the thickness of the first substrate W1 and the thickness of the second substrate W2 are used to manage a distance (gap) between the first substrate W1 and the second substrate W2 when bonding the first and second substrates W1 and W2 in a process A13 to be described later.

Furthermore, in the process A8, the degree of horizontality (vertical position) of the first holder 120 may be adjusted. In the control device 80, the degree of horizontality of the first holder 120 is measured based on the measurement results of the displacement meters 252 and 253. Then, the three vertical position adjusters 180 are controlled such that the attraction surface of the electrostatic chuck 121 of the first holder 120 becomes horizontal. By driving these three vertical position adjusters 180 individually, the three transmission shafts can be individually moved up and down to adjust the horizontality of the first holder 120.

Thereafter, the horizontal position of the first holder 120 is adjusted, and the horizontal positions of the first and second substrates W1 and W2 are adjusted (process A9 of FIG. 19).

In the process A9, as shown in FIG. 22A to FIG. 23B, the imaging units 210 and 211 are moved in the X-axis direction by the first moving mechanism 260, and the common lens unit 240 of each imaging unit 210 and 211 are disposed to correspond to the centers of the substrates W1 and W2 in the X-axis direction.

Next, the first imaging unit 210 is moved in the positive Y-axis direction by the second moving mechanism 270, and the common lens unit 240 is located to face the first alignment mark M11 and the second alignment mark M21. Then, the first imaging device 220 images the first alignment mark M11, and, at the same time, the second imaging device 230 images the second alignment mark M21. The images obtained by the first imaging unit 210 are outputted to the control device 80. In this way, since the imaging of the first alignment mark M11 and the imaging of the second alignment mark M21 are performed simultaneously, the imaging time can be shortened, and adjustment precision (alignment precision) of horizontal positions to be described later can also be improved.

Likewise, the second imaging unit 211 is moved in the negative Y-axis direction by the third moving mechanism 280, and the common lens unit 240 is positioned to face the first alignment mark M12 and the second alignment mark M22. Then, the first imaging device 220 images the first alignment mark M12, and, concurrently, the second imaging device 230 images the second alignment mark M22. The images obtained by the second imaging unit 211 are outputted to the control device 80.

In the control device 80, by performing the edge detection on the acquired images, the alignment marks M11, M21, M12 and M22 are detected. Then, the horizontal position adjuster 170 is controlled such that the cross shape of the first alignment mark M11 and the cross shape of the second alignment mark M21 are matched, and the cross shape of the first alignment mark M12 and the cross shape of the second alignment mark M22 are matched. By controlling this horizontal position adjuster 170, the horizontal position (the position and the direction in the horizontal direction) of the first holder 120 is adjusted.

The horizontal position adjuster 170 moves the first holder 120 in the horizontal direction or rotates it around a vertical axis. Accordingly, the horizontal positions of the first substrate W1 and the second substrate W2 are adjusted.

As described above, in the process A9, since the horizontal positions of the first substrate W1 and the second substrate W2 are adjusted by imaging the alignment marks M11, M21, M12 and M22 with the two imaging units 210 and 211, the adjustment precision (alignment precision) can be improved. Moreover, this adjustment can be carried out in a short time.

Subsequently, the first chuck marks N11 and N12 and the second chuck marks N21 and N22 are detected (process A10 of FIG. 19).

In the process A10, as depicted in FIG. 23A to FIG. 24B, the first imaging unit 210 is moved in the positive Y-axis direction by the second moving mechanism 270, and the common lens unit 240 of the first imaging unit 210 is placed at a position where it faces the first chuck mark N11 and the second chuck mark N21. Then, the first imaging device 220 images the first chuck mark N11, and the second imaging device 230 concurrently images the second chuck mark N21. The images obtained by the first imaging unit 210 are outputted to the control device 80.

Likewise, the second imaging unit 211 is moved in the negative Y-axis direction by the third moving mechanism 280, and the common lens unit 240 thereof is placed at a position where it faces the first chuck mark N12 and the second chuck mark N22. Then, the first imaging device 220 images the first chuck mark N12, and, at the same time, the second imaging device 230 images the second chuck mark N22. The images obtained by the second imaging unit 211 are outputted to the control device 80.

Here, before adjusting the horizontal positions of the substrates W1 and W2 in the process A9, the coordinates (x, y) of the pair of the chuck marks N11 and N21 facing each other are reference coordinates (0, 0). Afterwards, if the first holder 120 is moved in the horizontal direction in the process A9, the chuck marks N11 and N21 are also moved, so the coordinates (x, y) of the chuck marks N11 and N21 become ($\Delta$x1, $\Delta$y1). Likewise, the coordinates (x, y) of another pair of the chuck marks N12 and N22 become ($\Delta$x2, $\Delta$y2).

The control device 80 detects the chuck marks N11, N21, N12, and N22 by performing the edge detection on the acquired image data. Then, the aforementioned coordinates ($\Delta$x1, $\Delta$y1) of the chuck marks N11 and N21 and the coordinates ($\Delta$x2, $\Delta$y2) of the chuck marks N12 and N22 are calculated. In the control device 80, these coordinates ($\Delta$x1, $\Delta$y1) and ($\Delta$x2, $\Delta$y2) of the chuck marks are used when adjusting the horizontal position of the first holder 120 in a process A12 to be described later.

Furthermore, in the present embodiment, the alignment marks M11, M21, M12 and M22 and the chuck marks N11, N21, N12 and N22 are arranged on the same Y-axis. For this reason, the movement of the imaging units 210 and 211 in the process A10 may need to be made only in the Y-axis direction. Further, the distance D between the alignment marks M11, M21, M12 and M22 and the chuck marks N11, N21, N12 and N22, respectively, is small, for example, 20 mm to 30 mm. In this case, it is possible to suppress displacement of the posture of the imaging units 210 and 211 that might be caused by the movement of the imaging units 210 and 211. Therefore, the imaging precision by the imaging units 210 and 211 may be improved.

Upon the completion of the above-described processes A8 to A10, the imaging units 210 and 211 are moved in the negative X-axis direction by the first moving mechanism 260, and taken out of the processing vessel 110. Further, in the processes A9 and A10, the first imaging unit 210 moves in a first area B1 on the positive Y-axis side to acquire the images, and the second imaging unit 211 moves in a second area B2 on the negative Y-axis side to acquire the images, as shown in FIG. 23A and FIG. 23B.

Subsequently, the processing vessel 110 is hermetically sealed, and the inside of the processing vessel 110 is decompressed to a required vacuum level (process A11 in FIG. 19).

In the process A11, as illustrated in FIG. 25A and FIG. 25B, the first chamber 111 is lowered by the chamber elevating mechanism 140, thus allowing the first chamber 111 and the second chamber 112 to come into contact with each other. Then, a sealed space is formed inside the processing vessel 110. Then, the intake device 152 of the decompressing unit 150 is operated to decompress the processing vessel 110. Accordingly, the inside of the processing vessel 110 is maintained at the required vacuum level of, e.g., 1 Pa or less.

Here, in case of using the imaging units 210 and 211 as described above, since the vertical distance L1 between the first substrate W1 and the second substrate W2 is short, a moving distance can be reduced when the first chamber 111 is lowered. Therefore, a deviation of the horizontal position of the first holder 120 accompanying the lowering of the first chamber 111 can be suppressed. Further, the time taken for the process A11 can be shortened.

Next, the horizontal position of the first holder 120 is adjusted (process A12 of FIG. 19). Here, in the above-described process A11, the inside the processing vessel 110 is decompressed to cause a pressure fluctuation, so the horizontal position of the first holder 120 adjusted in the process A9 is slightly deviated due to the impact. As a resolution, the horizontal position of the first holder 120 is re-adjusted.

In the process A12, the first imaging device 200 images the first chuck mark N11 and the second chuck mark N21, and the second imaging device 201 images the first chuck mark N12 and the second chuck mark N22. The images obtained by the imaging devices 200 and 201 are outputted to the control device 80.

The control device 80 detects the chuck marks N11, N21, N12 and N22 by performing the edge detection on the acquired image data. Then, the coordinates ($\Delta$x1, $\Delta$y1) of the chuck marks N11 and N21 and the coordinates ($\Delta$x2, $\Delta$y2) of the chuck marks N12 and N22 obtained in the above-described process A10 are restored here. That is, the horizontal position adjuster 170 is controlled such that the chuck marks N11 and N21 are located on the coordinates ($\Delta$x1, $\Delta$y1) and the chuck marks N12 and N22 are located on the coordinates ($\Delta$x2, $\Delta$y2), as depicted in FIG. 26A and FIG. 26B. By controlling the horizontal position adjuster 170, the horizontal position (the position and the direction in the horizontal direction) of the first holder 120 is adjusted.

Then, the first substrate W1 and the second substrate W2 are bonded (process A13 of FIG. 19).

In the process A13, as shown in FIG. 27A and FIG. 27B, the first holder 120 is lowered by using the three vertical position adjusters 180, thus allowing the first substrate W1 and the second substrate W2 to be brought into contact with each other. At this time, the control device 80 controls the distance between the first substrate W1 and the second substrate W2 while taking the thicknesses of the first substrate W1 and the second substrate W2 measured in the process A8 into account.

Since the bonding surface W1a of the first substrate W1 and the bonding surface W2a of the second substrate W2 are modified in the processes A1 and A4, respectively, a Van der Waals force (intermolecular force) is generated between the bonding surfaces W1a and W2a, so that the bonding surfaces W1a and W2a are bonded to each other. Further, since the bonding surface W1a of the first substrate W1 and the bonding surface W2a of the second substrate W2 are hydro-philized in the processes A2 and A5, respectively, the hydrophilic groups between the bonding surfaces W1a and W2a are hydrogen-bonded (intermolecular force), so that the bonding surfaces W1a and W2a are firmly bonded to each other.

Thereafter, the first substrate W1 and the second substrate W2 are pressed to be bonded more securely (process A14 of FIG. 19).

In the process A14, the press rod 193 is vertically moved by using the pressing mechanism 191 of the pressing unit 190, as shown in FIG. 28A and FIG. 28B. Accordingly, the first holder 120 approaches the second holder 130, allowing the first substrate W1 held by the first holder 120 to be pressed against the second substrate W2 held by the second holder 130. At this time, the load applied to the first substrate W1 and the second substrate W2 is measured by using the measuring mechanism 192. Further, a pressing load may be, e.g., 30 kN. Then, as the first substrate W1 and the second substrate W2 are pressed, they are more firmly bonded to each other to form the combined substrate T.

FIG. 29 is an explanatory diagram showing a load state when the first substrate W1 and the second substrate W2 are pressed. As stated above, a pressing load P1 by the pressing unit 190 is 30 kN. In the meanwhile, a pressure difference load P2 of 18 kN between the atmospheric pressure outside the processing vessel 110 and the vacuum pressure inside the processing vessel 110 is applied to the top surface of the supporting plate 114 of the processing vessel 110. Then, the load substantially applied to the processing vessel 110 is 12 kN, which is obtained by subtracting the pressure difference load P2 from the pressing load P1. This load of 12 kN is borne by a reaction force P3 by the chamber elevating mechanism 140. Therefore, in the present exemplary embodiment, it is possible to bear the pressing load P1 without applying a load to the processing vessel 110.

Further, even when the first substrate W1 and the second substrate W2 are pressed as described above, no load is applied to the moving plate 161 of the support 160. The reason for this will be described below.

The first holder 120 is supported while being suspended from above by the transmission shafts 162. In addition, since the first holder 120 is pressed from above by the pressing unit 190, the transmission shafts 162 can be free from the pressing. Here, if the first holder 120 is pressed while the first substrate W1 and the second substrate W2 are in contact with each other, the first holder 120 may be deformed. When the first holder 120 is deformed, a stress may be applied to the moving plate 161 via the transmission shafts 162. However, if the motor of the vertical position adjuster 180 is stopped, the transmission shafts 162 and the moving plate 161 become free in the vertical direction. In this way, since the moving plate 161 and the first holder 120 become independent from each other with respect to the vertical direction, no load is applied to the moving plate 161. Since no load is applied to the moving plate 161, no load is applied to the horizontal position adjuster 170, either.

Accordingly, in the bonding apparatus 30 of the present exemplary embodiment, the high-load bonding process by the pressing unit 190 and the high-precision alignment by the horizontal position adjuster 170 via the support 160 can be both achieved.

Thereafter, the processing vessel 110 is opened to turn the inside of the processing vessel 110 to the atmospheric pressure (process A15 of FIG. 19).

In the process A15, the first chamber 111 is raised by the chamber elevating mechanism 140 to open the processing vessel 110, as shown in FIG. 30A and FIG. 30B. At this time, the attraction and holding of the first substrate W1 by the electrostatic chuck 121 of the first holder 120 is stopped, and the first holder 120 is also raised by the vertical position adjuster 180. Further, the pressing by the pressing unit 190 is also stopped.

Next, the attraction and holding of the second substrate W2 (combined substrate T) by the electrostatic chuck 131 of the second holder 130 is stopped, and the combined sub-strate T is then raised from the electrostatic chuck 131 by the elevating pins 133. Thereafter, as illustrated in FIG. 31A and FIG. 31B, the combined substrate T is handed over from the elevating pins 133 to the substrate transfer device 71, and is carried out of the bonding apparatus 30.

Thereafter, the combined substrate T is transferred into the transition device 61 by the substrate transfer device 71, and then transferred into the cassette Ct on the required cassette placing plate 11 by the substrate transfer device 22 of the carry-in/out station 2. Through these operations, the series of processes of the bonding processing for the sub-strates W1 and W2 are completed.

According to the above-described exemplary embodiment, since the horizontal positions of the first substrate W1 and the second substrate W2 can be appropriately adjusted in the process A9, the bonding accuracy for the first substrate W1 and the second substrate W2 can be improved in the process A13. Further, it is also possible to improve the throughput of the bonding processing.

Further, in the above-described exemplary embodiment, the first substrate W1 and the second substrate W2 are pressed against each other in the process A14 after they are bonded in the process A13. If the sufficient bonding strength is obtained in the process A13, the process A14 may be omitted. In this case, the pressing unit 190 may be omitted.

In addition, instead of omitting the pressing unit 190, a striker configured to lower only the center of the top surface of the first holder 120 may be provided. In this case, in the state that the first substrate W1 is bent to be projected downwards, the center of the first substrate W1 and the center of the second substrate W2 are brought into contact with each other. Then, the substrates W1 and W2 are sequentially bonded from the centers toward the peripheries thereof.

Although the above exemplary embodiment has been described for the example where the pressing unit 190 presses the first holder 120 vertically downwards, the pressing unit 190 may press the second holder 130 vertically upwards.

Further, in the above-described exemplary embodiment, although the alignment mechanism composed of the support 160, the horizontal position adjuster 170, and the vertical position adjuster 180 is provided at the first holder 120, it may be provided at the second holder 130.

In addition, although the above exemplary embodiment has been described for the example where the first holder 120 is positioned on the upper side whereas the second holder 130 is positioned on the lower side, the arrangement of the first holder 120 and the second holder 130 may be vertically inverted. Further, although the first holder 120 is configured to be vertically movable in the above-described exemplary embodiment, the second holder 130 may be configured to be vertically movable instead, or both the first holder 120 and the second holder 130 may be configured to be vertically movable.

Additionally, although the first substrate W1 and the second substrate W2 are bonded in the vacuum atmosphere, the present exemplary embodiment may also be applicable to a case where they are bonded in the atmospheric atmosphere.

It should be noted that the exemplary embodiment is illustrative in all aspects and is not anyway limiting. The above-described exemplary embodiment may be omitted, replaced and modified in various ways without departing from the scope and the spirit of claims.

The following configurations also belong to the technical scope of the present disclosure.

(1) A bonding apparatus configured to bond a first substrate and a second substrate, including: a first holder configured to hold the first substrate; a second holder disposed to face the first holder, and configured to hold the second substrate; two imaging units each including a first imaging device configured to image a first alignment mark formed on a bonding surface of the first substrate and a second imaging device configured to image a second alignment mark formed on a bonding surface of the second substrate; a first moving mechanism configured to move the two imaging units along a first direction in a planar region between the first holder and the second holder; a second moving mechanism configured to move the first imaging unit of the two imaging units along a second direction orthogonal to the first direction; and a third moving mechanism configured to move the second imaging unit of the two imaging units along the second direction.

(2) The bonding apparatus of the above (1), further including: a controller configured to control the first moving mechanism, the second moving mechanism and the third moving mechanism such that the first imaging unit images a first region and the second imaging unit images a second region.

(3) The bonding apparatus of the above (1) or (2), wherein each of the imaging units includes a refection mirror configured to change a first optical path of the first imaging device toward a first substrate side, and also configured to change a second optical path of the second imaging device toward a second substrate side, the second optical path being coaxial with the first optical path.

(4) The bonding apparatus of any one of the above (1) to (3), wherein the first imaging device images a first holding mark formed on the first holder, and the second imaging device images a second holding mark formed on the second holder.

(5) The bonding apparatus of the above (4), further including: a processing vessel accommodating therein the first holder and the second holder; and a fixed imaging device configured to image the first holding mark and the second holding mark from an outside of the processing vessel.

(6) The bonding apparatus of any one of the above (1) to (5), further including: a first reference mark provided at a position spaced apart from the first holder and the second holder in the first direction when viewed from a top to be imaged by the first imaging device; and a second reference mark provided to face the first reference mark to be imaged by the second imaging device.

(7) A bonding system configured to bond a first substrate and a second substrate, including: a processing station including a bonding apparatus configured to bond the first substrate and the second substrate; and a carry-in/out station configured to carry the first substrate, the second substrate, and a combined substrate in which the first second optical path and the second substrate are bonded to each other with respect to the processing station, wherein the bonding apparatus includes: a first holder configured to hold the first substrate; a second holder disposed to face the first holder, and configured to hold the second substrate; two imaging units each including a first imaging device configured to image a first alignment mark formed on a bonding surface of the first substrate and a second imaging device configured to image a second alignment mark formed on a bonding surface of the second substrate; a first moving mechanism configured to move the two imaging units along a first direction in a planar region between the first holder and the second holder; a second moving mechanism configured to move the first imaging unit of the two imaging units along a second direction orthogonal to the first direction; and a third moving mechanism configured to move the second imaging unit of the two imaging units along the second direction.

(8) A bonding method of bonding a first substrate and a second substrate by using a bonding apparatus, wherein the bonding apparatus includes: a first holder configured to hold the first substrate; a second holder disposed to face the first holder, and configured to hold the second substrate; two imaging units each including a first imaging device configured to image a first alignment mark formed on a bonding surface of the first substrate and a second imaging device configured to image a second alignment mark formed on a bonding surface of the second substrate; a first moving mechanism configured to move the two imaging units along a first direction in a planar region between the first holder and the second holder; a second moving mechanism configured to move the first imaging unit of the two imaging units along a second direction orthogonal to the first direction; and a third moving mechanism configured to move the second imaging unit of the two imaging units along the second direction, and wherein the bonding method includes: (a) holding the first substrate by the first holder; (b) holding the second substrate by the second holder; (c) moving the first imaging unit and the second imaging unit in the first direction by the first moving mechanism; (d) moving the first imaging unit in the second direction by the second moving mechanism; (e) moving the second imaging unit in the second direction by the third moving mechanism; (f) imaging the first alignment mark and the second alignment mark by the first imaging unit and the second imaging unit, respectively; and (g) adjusting a horizontal position between the first substrate held by the first holder and the second substrate held by the second holder based on images obtained in the process (f).

(9) The bonding method of the above (8), wherein in the process (d), the first imaging unit is moved in a first region, in the process (e), the second imaging unit is moved in a second region, and in the process (f), the first region is imaged by the first imaging unit and the second region is imaged by the second imaging unit.

(10) The bonding method of the above (8) or (9), wherein each of the imaging units includes a refection mirror configured to change a first optical path of the first imaging device toward a first substrate side, and also configured to change a second optical path of the second imaging device toward a second substrate side, the second optical path being coaxial with the first optical path, and in the process (f), the first alignment mark and the second alignment mark are imaged by the imaging units at the same time.

(11) The bonding method of any one of the above (8) to (10), wherein, after the process (g), the first imaging unit is moved in the second direction by the second moving mechanism, the second imaging unit is moved in the second direction by the third imaging unit, and wherein, in each of the first imaging unit and the second imaging unit, a first holding mark formed on the first holder is imaged by the first imaging device, and a second holding mark formed on the second holder is imaged by the second holder.

(12) The bonding method of any one of the above (8) to (11), wherein the bonding apparatus further includes: a first reference mark provided at a position spaced apart from the first holder and the second holder in the first direction when viewed from a top to be imaged by the first imaging device; and a second reference mark provided to face the first reference mark to be imaged by the second imaging device, and wherein in the process (c), the first reference mark is imaged by the first imaging device, and the second reference mark is imaged by the second imaging device.

According to the exemplary embodiments, it is possible to improve the bonding accuracy when bonding the substrates.

We claim:
1. A bonding apparatus configured to bond a first substrate and a second substrate, comprising:
a first holder configured to hold the first substrate;
a second holder disposed to face the first holder, and configured to hold the second substrate;

two imaging units each including a first imaging device configured to image a first alignment mark formed on a bonding surface of the first substrate and a second imaging device configured to image a second alignment mark formed on a bonding surface of the second substrate;
a first moving mechanism configured to move the two imaging units along a first direction in a planar region between the first holder and the second holder;
a second moving mechanism configured to move the first imaging unit of the two imaging units along a second direction orthogonal to the first direction; and
a third moving mechanism configured to move the second imaging unit of the two imaging units along the second direction,
wherein each of the imaging units comprises a lens unit,
the lens unit comprises an upper lens, a lower lens, and a reflection mirror, and
the reflection mirror is configured to change a first optical path of the first imaging device toward a first substrate side through the upper lens, and to change a second optical path of the second imaging device toward a second substrate side through the lower lens, the second optical path being coaxial with the first optical path.

2. The bonding apparatus of claim 1, further comprising:
a controller configured to control the first moving mechanism, the second moving mechanism and the third moving mechanism such that the first imaging unit images a first region and the second imaging unit images a second region.

3. The bonding apparatus of claim 1,
wherein the first imaging device images a first holding mark formed on the first holder, and
the second imaging device images a second holding mark formed on the second holder.

4. The bonding apparatus of claim 3, further comprising:
a processing vessel accommodating therein the first holder and the second holder; and
a fixed imaging device configured to image the first holding mark and the second holding mark from outside of the processing vessel.

5. The bonding apparatus of claim 1, further comprising:
a first reference mark provided at a position spaced apart from the first holder and the second holder in the first direction when viewed from a top to be imaged by the first imaging device; and
a second reference mark provided to face the first reference mark to be imaged by the second imaging device.

6. A bonding system configured to bond a first substrate and a second substrate, comprising:
a processing station comprising a bonding apparatus configured to bond the first substrate and the second substrate; and
a carry-in/out station configured to carry the first substrate, the second substrate, and a combined substrate in which the first substrate and the second substrate are bonded to each other with respect to the processing station,
wherein the bonding apparatus comprises:
a first holder configured to hold the first substrate;
a second holder disposed to face the first holder, and configured to hold the second substrate;
two imaging units each including a first imaging device configured to image a first alignment mark formed on a bonding surface of the first substrate and a second imaging device configured to image a second alignment mark formed on a bonding surface of the second substrate;

a first moving mechanism configured to move the two imaging units along a first direction in a planar region between the first holder and the second holder, a second moving mechanism configured to move the first imaging unit of the two imaging units along a second direction orthogonal to the first direction; and a third moving mechanism configured to move the second imaging unit of the two imaging units along the second direction, wherein each of the imaging units comprises a lens unit, the lens unit comprises an upper lens, a lower lens, and a reflection mirror, and the reflection mirror is configured to change a first optical path of the first imaging device toward a first substrate side through the upper lens, and to change a second optical path of the second imaging device toward a second substrate side through the lower lens, the second optical path being coaxial with the first optical path.

7. A bonding method of bonding a first substrate and a second substrate by using a bonding apparatus, wherein the bonding apparatus comprises:

a first holder configured to hold the first substrate;

a second holder disposed to face the first holder, and configured to hold the second substrate;

two imaging units each including a first imaging device configured to image a first alignment mark formed on a bonding surface of the first substrate and a second imaging device configured to image a second alignment mark formed on a bonding surface of the second substrate;

a first moving mechanism configured to move the two imaging units along a first direction in a planar region between the first holder and the second holder;

a second moving mechanism configured to move the first imaging unit of the two imaging units along a second direction orthogonal to the first direction; and a third moving mechanism configured to move the second imaging unit of the two imaging units along the second direction, wherein each of the imaging units comprises a lens unit, the lens unit comprises an upper lens, a lower lens, and a reflection mirror, and the reflection mirror is configured to change a first optical path of the first imaging device toward a first substrate side through the upper lens, and to change a second optical path of the second imaging device toward a second substrate side through the lower lens, the second optical path being coaxial with the first optical path, and wherein the bonding method comprises:

holding the first substrate by the first holder;

holding the second substrate by the second holder;

moving the first imaging unit and the second imaging unit in the first direction by the first moving mechanism;

moving the first imaging unit in the second direction by the second moving mechanism;

moving the second imaging unit in the second direction by the third moving mechanism;

imaging the first alignment mark and the second alignment mark by the first imaging unit and the second imaging unit, respectively; and adjusting a horizontal position between the first substrate held by the first holder and the second substrate held by the second holder based on images obtained in the imaging of the first alignment mark and the second alignment mark.

8. The bonding method of claim 7, wherein in the moving of the first imaging unit, the first imaging unit is moved in a first region, in the moving of the second imaging unit, the second imaging unit is moved in a second region, and in the imaging of the first alignment mark and the second alignment mark, the first region is imaged by the first imaging unit and the second region is imaged by the second imaging unit.

9. The bonding method of claim 7, wherein in the imaging of the first alignment mark and the second alignment mark, the first alignment mark and the second alignment mark are imaged by the imaging units at the same time.

10. The bonding method of claim 7, wherein, after the adjusting of the horizontal position, the first imaging unit is moved in the second direction by the second moving mechanism, the second imaging unit is moved in the second direction by the third imaging unit, and wherein, in each of the first imaging unit and the second imaging unit, a first holding mark formed on the first holder is imaged by the first imaging device, and a second holding mark formed on the second holder is imaged by the second holder.

11. The bonding method of claim 7, wherein the bonding apparatus further comprises:

a first reference mark provided at a position spaced apart from the first holder and the second holder in the first direction when viewed from a top to be imaged by the first imaging device; and a second reference mark provided to face the first reference mark to be imaged by the second imaging device, and wherein in the moving of the first imaging unit, the first reference mark is imaged by the first imaging device, and the second reference mark is imaged by the second imaging device.

* * * * *